(12) United States Patent
Hsieh et al.

(10) Patent No.: US 11,855,644 B2
(45) Date of Patent: *Dec. 26, 2023

(54) DIGITALLY CONTROLLED DELAY LINE CIRCUIT AND METHOD

(71) Applicant: TAIWAN SEMICONDUCTOR MANUFACTURING COMPANY, LTD., Hsinchu (TW)

(72) Inventors: Chung-Peng Hsieh, Hsinchu (TW); Chih-Chiang Chang, Hsinchu (TW); Yung-Chow Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/155,906

(22) Filed: Jan. 18, 2023

(65) Prior Publication Data

US 2023/0155583 A1    May 18, 2023

Related U.S. Application Data

(63) Continuation of application No. 17/376,389, filed on Jul. 15, 2021, now Pat. No. 11,563,429, which is a
(Continued)

(51) Int. Cl.
*H03K 5/14* (2014.01)
*H03K 5/134* (2014.01)
*H03K 5/131* (2014.01)
*H03K 5/24* (2006.01)

(52) U.S. Cl.
CPC ............. *H03K 5/14* (2013.01); *H03K 5/131* (2013.01); *H03K 5/134* (2014.07); *H03K 5/2481* (2013.01)

(58) Field of Classification Search
None
See application file for complete search history.

(56) References Cited

U.S. PATENT DOCUMENTS

| 5,355,037 A | 10/1994 | Andresen et al. |
| 7,525,356 B2 | 4/2009 | Hui et al. |

(Continued)

FOREIGN PATENT DOCUMENTS

| JP | 2013005177 | 1/2013 |
| KR | 101342093 | 12/2013 |

(Continued)

OTHER PUBLICATIONS

Office Action dated Jun. 15, 2022 for corresponding case No. KR 10-2020-0184764 (pp. 1-6). English Abstract attached on p. 1.

(Continued)

*Primary Examiner* — Cassandra F Cox
(74) *Attorney, Agent, or Firm* — Hauptman Ham, LLP

(57) ABSTRACT

A digitally controlled delay line (DCDL) includes input and output terminals, and a plurality of stages that propagate a signal along a first signal path from the input terminal to a selectable return stage and along a second signal path from the return stage to the output terminal. Each stage includes a first inverter that selectively propagates the signal along the first signal path, a second inverter that selectively propagates the signal along the second signal path, and a third inverter that selectively propagates the signal from the first signal path to the second signal path. At least one of the first or third inverters includes a tuning portion including either a plurality of parallel, independently controllable p-type transistors coupled in series with a single independently controllable n-type transistor, or a plurality of paral-
(Continued)

lel, independently controllable n-type transistors coupled in series with a single independently controllable p-type transistor.

20 Claims, 15 Drawing Sheets

Related U.S. Application Data continuation of application No. 17/030,160, filed on Sep. 23, 2020, now Pat. No. 11,082,035.

(60) Provisional application No. 63/012,980, filed on Apr. 21, 2020.

(56) References Cited

U.S. PATENT DOCUMENTS

| | | | |
|---|---|---|---|
| 7,932,765 B2 | 4/2011 | Kapusta | |
| 9,490,785 B1 | 11/2016 | Sridhar | |
| 10,277,215 B2 | 4/2019 | Tsai | |
| 10,965,280 B2 | 3/2021 | Qu et al. | |
| 11,005,464 B1 | 5/2021 | Lin | |
| 2010/0327934 A1 | 12/2010 | Kapusta et al. | |
| 2013/0257501 A1* | 10/2013 | Kubotera | H03K 5/133 327/276 |
| 2018/0316337 A1* | 11/2018 | Tsai | H03K 5/133 |

FOREIGN PATENT DOCUMENTS

| | | |
|---|---|---|
| TW | 200718018 A | 5/2007 |
| TW | I316258 B | 10/2009 |
| TW | 201620250 A | 6/2016 |

OTHER PUBLICATIONS

Office Action dated Sep. 16, 2021 for corresponding case. No. 11020908630 (pp. 1-7).

\* cited by examiner

600

610 — Receive a first signal at a first stage of a plurality of adjacent stages of a DCDL.

620 — Select a second stage of the plurality of adjacent stages as a return stage, thereby activating a first tunable inverter of the second stage as part of a signal delay path of the DCDL. For each stage of the plurality of adjacent stages, selecting the second stage includes activating a given tunable inverter in the signal delay path configured to receive a signal transition having a same polarity as a polarity of a signal transition of the input signal, the given tunable inverter being the first tunable inverter of the second stage or another activated tunable inverter 630 — Output a second signal from the first stage of the plurality of adjacent stages of the DCDL

FIG. 6

DIGITALLY CONTROLLED DELAY LINE CIRCUIT AND METHOD

PRIORITY CLAIM

The present application is a continuation of U.S. application Ser. No. 17/376,389, filed Jul. 15, 2021, now U.S. Pat. No. 11,563,429, issued Jan. 24, 2023, which is a continuation of U.S. application Ser. No. 17/030,160, filed Sep. 23, 2020, now U.S. Pat. No. 11,082,035, issued Aug. 3, 2021, which claims the priority of U.S. Provisional Application No. 63/012,980, filed Apr. 21, 2020, each of which is incorporated herein by reference in its entirety.

BACKGROUND

Delay lines, including digitally controlled delay lines (DCDL) provide programmable delay times for an input signal routed through cascaded delay stages. DCDL circuits are implemented using delay stages configurable via control signals to cause the input signal to either pass to the next delay stage or be propagated to a return path. To obtain a given delay time, a predetermined number of cascaded delay stages is activated to provide the forward and return paths for the input signal.

In some cases, DCDLs are included in delay-locked loop (DLL) circuits in which the programmable delay times are used to synchronize clock signals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flowchart of a method of controlling a signal delay time, in accordance with some embodiments.

DETAILED DESCRIPTION

Figure 1:
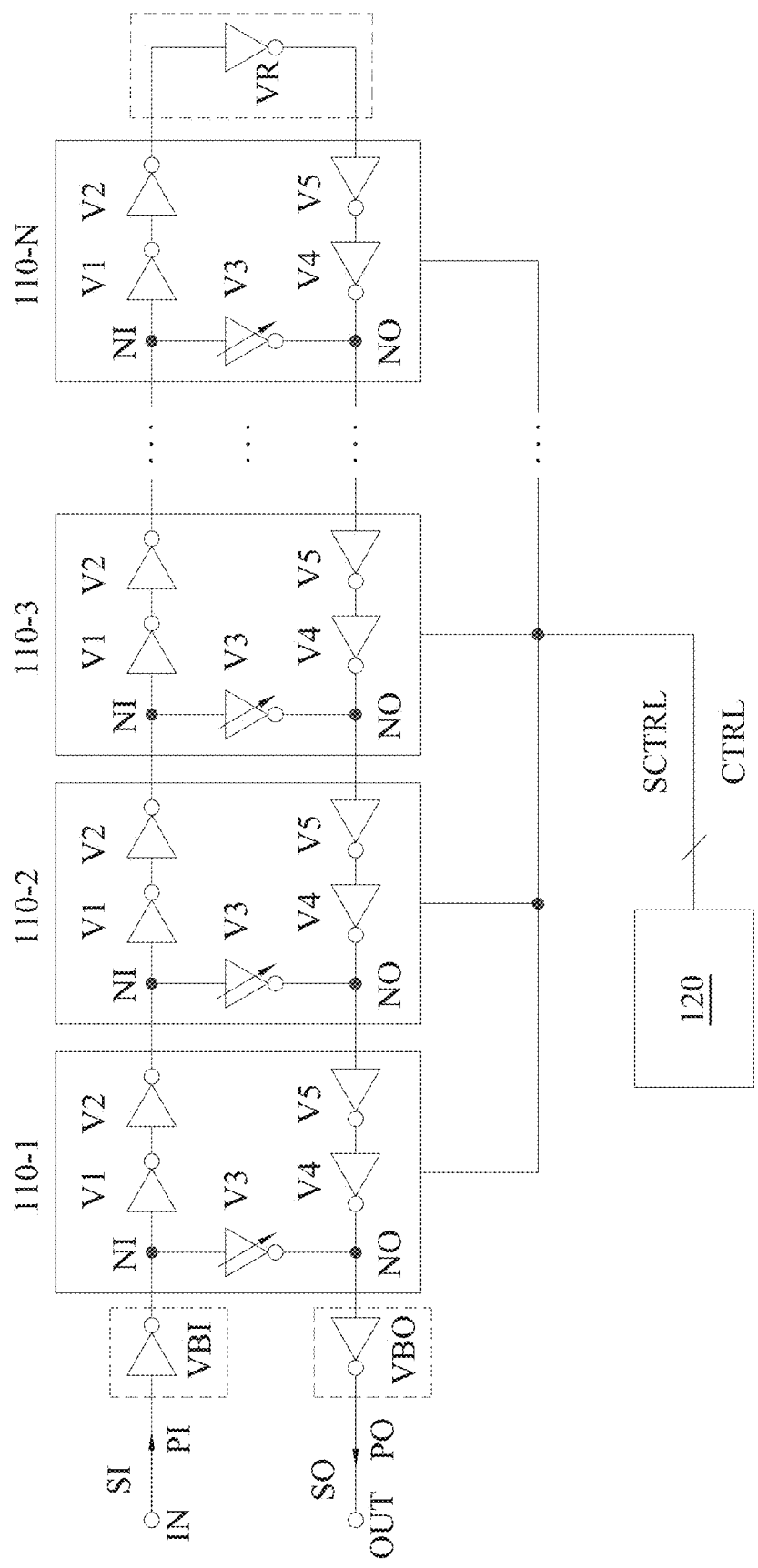
FIG. 1 is a schematic diagram of a DCDL circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a DCDL receives a given one of a rising or falling signal transition, and is configurable to cause each signal path corresponding to a range of programmable delay times to include a tunable delay cell that receives the given signal transition. By always including a tunable delay cell that receives the same signal transition polarity within the range of programmable delay times, the DCDL is capable of improved delay time control compared to approaches in which each signal path does not include a tunable delay cell that receives the same signal transition, thereby increasing delay time linearity.

In some embodiments, a DCDL includes single-sided tunable delay cells configured to implement programmable delay times for a given one of a rising or falling signal transition by using fewer transistors than approaches in which tunable delay cells are configured to implement programmable delay times for both rising and falling signal transitions, thereby reducing circuit size, complexity, and process variation effects.

FIG. 1 is a schematic diagram of a DCDL circuit 100, in accordance with some embodiments. DCDL circuit 100, also referred to as DCDL 100 in some embodiments, is an integrated circuit (IC) including an input terminal IN, an output terminal OUT, stages 110-1 . . . 110-N, a control circuit 120, and a control signal bus CTRL. In various embodiments, DCDL circuit 100 includes one or more of an input buffer VBI, an output buffer VBO, or a return inverter VR, as discussed below. In some embodiments, DCDL circuit 100 is a portion of another circuit, e.g., a DLL circuit 1100 discussed below with respect to FIG. 11.

Stage 110-1 is coupled to each of input terminal IN and output terminal OUT, stages 110-1 . . . 110-N are sequentially coupled to each other in a cascade configuration, and each of stages 110-1 . . . 110-N is coupled to control circuit 120 through control signal bus CTRL. Stages 110-1 . . . 110-N are thereby configured as first through Nth sequentially coupled stages coupled to input terminal IN and output terminal OUT.

Two or more circuit elements are considered to be coupled based on a direct electrical connection or a conductive path that includes one or more additional circuit elements, e.g., one or more switching devices or logic or transmission gates, and is thereby capable of being controlled, e.g., made resistive or open by a transistor or other switching device.

In some embodiments, a DCDL circuit, e.g., DCDL circuit 100, includes a number N of stages, e.g., stages 110-1 . . . 110-N, ranging from 16 to 128. In some embodiments, a DCDL circuit, e.g., DCDL circuit 100, includes a number N of stages, e.g., stages 110-1 . . . 110-N, ranging from 32 to 64. In some embodiments, a DCDL circuit, e.g., DCDL circuit 100, includes a number N of stages, e.g., stages 110-1 . . . 110-N, fewer than 16 or greater than 128.

DCDL circuit 100 is configured to receive a signal SI at input terminal IN, and stages 110-1 . . . 110-N are configured to return a signal SO at output terminal OUT by applying a programmable delay time to signal SI responsive to control signals SCTRL received on control signal bus CTRL and generated by control circuit 120. Input terminal IN along with selectable portions of stages 110-1 . . . 110-N are thereby configured as an input path PI, and selectable portions of stages 110-1 . . . 110-N along with output terminal OUT are thereby configured as an output path PO.

A stage, e.g., one of stages 110-1 . . . 110-N, also referred to as a delay stage in some embodiments, is an electronic circuit including a plurality of cells, e.g., inverters, configurable responsive to a plurality of control signals, e.g., control signals SCTRL, so as to either selectively activate at least one cell coupled between input path PI and output path PO, or selectively activate at least one cell in input path PI coupled to a next sequentially coupled stage and at least one cell in output path PO coupled to the next sequentially coupled stage.

Each of stages 110-1 . . . 110-N includes a node NI and inverters V1 and V2 coupled in series along input path PI, a node NO and inverters V4 and V5 coupled in series along output path PO, and a tunable inverter V3 coupled between input path PI and output path PO at respective nodes NI and NO.

In the embodiment depicted in FIG. 1, tunable inverter V3 is coupled to input path PI at node NI between input terminal IN and inverters V1 and V2, and coupled to output path PO at node NO between output terminal OUT and inverters V4 and V5. In some embodiments, tunable inverter V3 is coupled to input path PI at node NI between inverters V1 and V2, and coupled to output path PO at node NO between inverters V4 and V5. In some embodiments, tunable inverter V3 is coupled to input path PI at node NI such that inverters V1 and V2 are between input terminal IN and node NI, and coupled to output path PO at node NO such that inverters V4 and V5 are between output terminal OUT and node NO.

Each of inverters V1, V2, V4, and V5, also referred to as a coarse-tune delay cell in some embodiments, is a tristate inverter configured to have either an activated or inactivated state responsive to one or more of control signals SCTRL received on control signal bus CTRL. In the activated state, a tristate inverter, e.g., an inverter V1, V2, V4, or V5, is configured to generate an output signal complementary to a received input signal and having a delay time between a transition in the input signal and the resultant transition in the output signal, the delay time being controlled by a switching speed of the inverter. In the inactivated state, the tristate inverter, e.g., an inverter V1, V2, V4, or V5, is configured to have a high output impedance independent of the received input signal.

The high output impedance of the inactivated state corresponds to a first output state of the tristate inverter, the output signal having a high voltage level in response to the input signal having a low voltage level corresponds to a second output state, and the output signal having the low voltage level in response to the input signal having the high voltage level corresponds to a third output state.

In some embodiments, a tristate inverter, e.g., an inverter V1, V2, V4, or V5, includes a plurality of p-type and n-type transistors coupled in series between a power supply node and a reference, e.g., ground, node (not shown in FIG. 1), and is thereby configured to, in operation, have the inactivated state corresponding to a first complementary pair of transistors (not shown in FIG. 1) being switched off in response to the control signals, to have the activated state corresponding to the first complementary pair of transistors being switched on in response to the control signals, and to output the output signal in response to receiving the input signal at gates of a second complementary pair of transistors. In some embodiments, one or more of inverters V1, V2, V4, or V5 is tristate inverter 400 discussed below with respect to FIG. 4.

Tunable inverter V3, also referred to as a fine-tune delay cell in some embodiments, is an inverter configured to have either the inactivated state or one of a plurality of activated states responsive to one or more of control signals SCTRL received on control signal bus CTRL. In each of the pluralities of activated states, a tunable inverter, e.g., tunable inverter V3, is configured to generate an output signal complementary to a received input signal and having a switching speed corresponding to a selected one of the pluralities of activated states. The switching speed corresponding to the selected activated state controls a delay time between a transition in the input signal and the resultant transition in the output signal such that the tunable inverter has a plurality of delay times corresponding to the plurality of activated states.

The high output impedance of the inactivated state corresponds to a first output state of the tunable inverter, the output signal having the high voltage level and a first switching speed in response to the input signal having the low voltage level corresponds to a second output state, the output signal having the low voltage level and first switching speed in response to the input signal having the high voltage level corresponds to a third output state, and the output signal having the high or low voltage level and at least one additional switching speed in response to the input signal having the respective low or high voltage level corresponds to the tunable inverter having greater than three output states.

In some embodiments, a tunable inverter, e.g., tunable inverter V3, includes a plurality of p-type and n-type transistors configured as discussed above with respect to a tristate inverter, and further includes at least one additional p-type or n-type transistor arranged in parallel with a same type transistor of the plurality of p-type and n-type transistors. The tunable inverter is thereby configured to, in operation, have the plurality of activated states corresponding to combinations of the parallel transistors being switched on and off in response to the control signals. In various embodiments, tunable inverter V3 is a tunable inverter 500 discussed below with respect to FIG. 5 or one of tunable inverters 800A or 800B discussed below with respect to FIGS. 8A and 8B.

Control circuit 120 is an electronic circuit configured to generate and output control signals SCTRL configured to cause tunable inverter V3 of an nth stage 110-n (any one of stages 110-1 . . . 110-N) to have a predetermined one of the activated states, and tunable inverters V3 of each of the other stages 110-1 . . . 110-N to have the inactive state, thereby selecting stage 110-*n* as a return stage by which signal SI on input path PI is propagated to output path PO and generating signal SO, in operation. In some embodiments, DCDL circuit 100 includes a return inverter VR, and control circuit 120 is configured to generate and output control signals SCTRL alternatively configured to cause tunable inverters V3 of each of stages 110-1 . . . 110-N to have the inactive state, thereby causing return inverter VR to propagate signal SI from input path PI to output path PO and generating signal SO, in operation.

Control circuit 120 is configured to generate and output control signals SCTRL configured to further cause each inverter V1 and V2 between input terminal IN and node NI of the selected return stage (or return inverter VR) and each inverter V4 and V5 between output terminal OUT and node NO of the selected return stage (or return inverter VR) to have the active state. In various embodiments, for a given one of stages 110-1 . . . 110-N, inverters V1 and V2 are configured to receive a same set of control signals SCTRL or different sets of control signals SCTRL, and inverters V4 and V5 are configured to receive a same set of control signals SCTRL or different sets of control signals SCTRL.

In operation, the activated inverters V1 and V2 between input terminal IN and node NI of the selected return stage (or return inverter VR) are thereby configured as some or all of input path PI, and the activated inverters V4 and V5 between node NO of the selected return stage (or return inverter VR) and output terminal OUT are thereby configured as some or all of output path PO. Input path PI, tunable inverter V3 of the selected return stage, and output path PO are thereby configured as a signal delay path of DCDL 100.

In operation, unless stage 110-1 as depicted in FIG. 1 is selected as the return stage, inverter V1 of stage 110-1 receives a transition in signal SI at node NI and propagates the received transition along input path PI to inverter V2 of stage 110-1 as an inverted transition delayed by the delay time of inverter V1. In turn, inverter V2 propagates the received transition in signal SI along input path PI to node NI of stage 110-2 as an inverted transition delayed by the delay time of inverter V2. This propagation sequence is repeated for each activated inverter V1 and V2 along input path PI.

Tunable inverter V3 of the selected return stage (or return inverter VR) receives the final transition in signal SI at node NI on input path PI, and propagates the final transition to node NO of output path PO as an inverted transition delayed by the delay time of tunable inverter V3 corresponding to the predetermined one of the active states determined by control signals SCTRL (or a delay time of return inverter VR).

In a sequence analogous to that of input path PI, the inverted transition from tunable inverter V3 of the selected return stage is propagated along output path PO by each activated inverter V4 and V5 along output path PO as an inverted transition delayed by the delay time of the corresponding inverter V4 or V5.

In operation, signal SO is thereby generated on output terminal OUT including a transition delayed relative to the transition in signal SI by a total delay time based on a sum of the delay times of each of inverters V1 and V2 in input path PI, each of inverters V4 and V5 in output path PO, and tunable inverter V3 of the selected return stage. In some embodiments in which DCDL circuit 100 includes return inverter VR and a stage 110-1 . . . 110-N is not selected as a return stage, the total delay time is based on a sum of the delay times of each of inverters V1 and V2 in input path PI, the delay times of each of inverters V4 and V5 in output path PO, and the delay time of return inverter VR.

In operation, the transition in signal SO has a polarity relative to the transition in signal SI based on a total number of inverters included in input path PI, output path PO, and either tunable inverter V3 of the selected return stage or return inverter VR in some embodiments. Thus, an odd total number of inverters corresponds to signal SO having a transition polarity opposite that of signal SI, and an even total number of inverters corresponds to signal SO having a same transition polarity as that of signal SI.

In some embodiments, DCDL circuit 100 includes neither input buffer VBI nor output buffer VBO, and the total number of inverters is an odd number equal to the sum of the number of inverters V1 and V2 included in input path PI, the number of inverters V4 and V5 included in output path PO, plus one inverter being either tunable inverter V3 of the selected return stage or return inverter VR. In operation, in such embodiments, a transition in signal SI received at input terminal IN having a given polarity thereby causes signal SO at output terminal OUT to have a transition having the opposite polarity and delayed by a total delay time equal to the sum of the delay times of each of inverters V1 and V2 in input path PI, each of inverters V4 and V5 in output path PO, and tunable inverter V3 of the selected return stage or return inverter VR.

In some embodiments, DCDL circuit 100 includes one of input buffer VBI or output buffer VBO, and the total number of inverters is an even number equal to the sum of the number of inverters V1 and V2 included in input path PI, the number of inverters V4 and V5 included in output path PO, one inverter being either tunable inverter V3 of the selected return stage or return inverter VR, plus the one of input buffer VBI or output buffer VBO. In operation, in such embodiments, a transition in signal SI received at input terminal IN having a given polarity thereby causes signal SO at output terminal OUT to have a transition having the same polarity and delayed by a total delay time equal to the sum of the delay times of each of inverters V1 and V2 in input path PI, the delay times of each of inverters V4 and V5 in output path PO, the delay time of either tunable inverter V3 of the selected return stage or return inverter VR, plus a delay time of either input buffer VBI in input path PI or output buffer VBO in output path PO.

In operation, the delay time of an inverter, e.g., one of inverters V1, V2, V4, or V5 or tunable inverter V3, is based on the switching speed of one or more n-type transistors when generating a falling output signal transition in response to a rising input signal transition, and on the switching speed of one or more p-type transistors when generating a rising output signal transition in response to a falling input signal transition. Accordingly, in the case of tunable inverter V3, control of the plurality of delay times is based on switching speeds of a plurality of n-type transistors when responding to the rising input signal transition or switching speeds of a plurality of p-type transistors when responding to the falling input signal transition.

By the configuration discussed above, tunable inverter V3 of each of stages 110-1 . . . 110-N of DCDL circuit 100 is configured to receive an input signal having a same transition polarity. For each programmable delay time of DCDL circuit 100 based on a selected return stage, control of the delay time component contributed by the corresponding tunable inverter V3 is therefore based on switching speeds of a plurality of transistors being same type transistors.

Transistor switching speeds vary as a function of manufacturing process variations such that switching speed variations among same type transistors are often smaller than switching speed variations between different type transistors. By configuring each programmable delay time to be based on a tunable inverter V3 having a delay time based on same transistor switching speeds, DCDL circuit 100 is capable of having improved delay time control, and thereby increased delay time linearity, compared to approaches in which each programmable delay time is not based on same transistor switching speeds.

Figure 2:
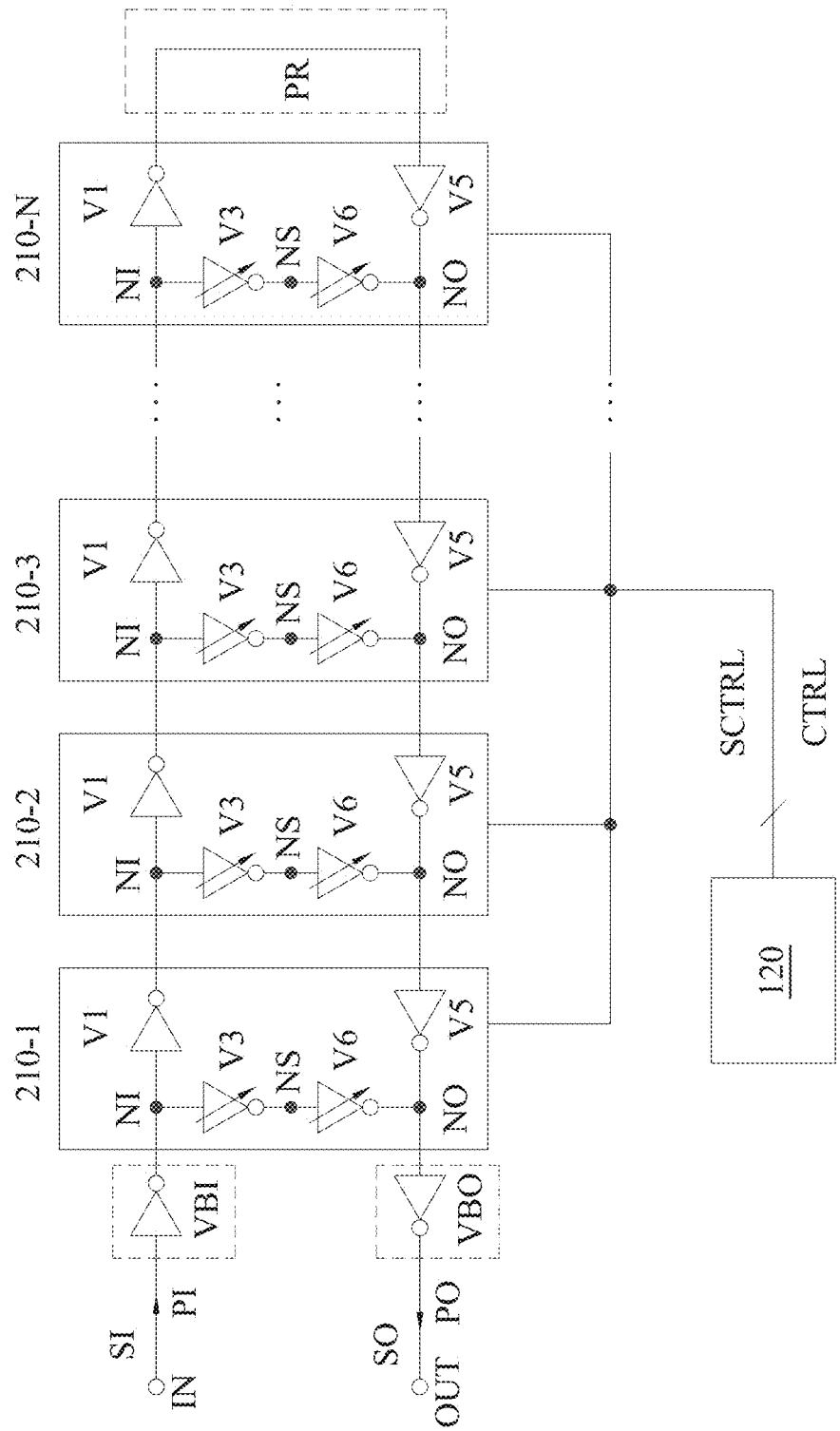
FIG. 2 is a schematic diagram of a DCDL circuit, in accordance with some embodiments.

FIG. 2 is a schematic diagram of a DCDL circuit 200, in accordance with some embodiments. DCDL circuit 200, also referred to as DCDL 200 in some embodiments, is an integrated circuit (IC) including input terminal IN, output terminal OUT, control circuit 120, and control signal bus CTRL, each discussed above with respect to FIG. 1. Instead of stages 110-1 . . . 110-N and return inverter VR, DCDL circuit 200 includes stages 210-1 . . . 210-N and, in some embodiments, a return path PR. In various embodiments, DCDL circuit 200 includes one of input buffer VBI or output buffer VBO, each discussed above with respect to FIG. 1. In some embodiments, DCDL circuit 200 is a portion of another circuit, e.g., DLL circuit 1100 discussed below with respect to FIG. 11.

Stages 210-1 . . . 210-N of DCDL circuit 200 are arranged in the manner discussed above with respect to FIG. 1, and DCDL 200 is thereby configured to receive signal SI at input terminal IN, and stages 210-1 . . . 210-N are configured to return signal SO at output terminal OUT by applying a programmable delay time to signal SI responsive to control signals SCTRL received on control signal bus CTRL and generated by control circuit 120. Input terminal IN along with selectable portions of stages 210-1 . . . 210-N are thereby configured as input path PI, and selectable portions of stages 210-1 . . . 210-N along with output terminal OUT are thereby configured as output path PO.

Each of stages 210-1 . . . 210-N includes nodes NI and NO, inverters V1 and V5, and tunable inverter V3, each discussed above with respect to FIG. 1. Compared to stages 110-1 . . . 110-N, each of stages 210-1 . . . 210-N does not include inverter V2 in series with inverter V1, or inverter V4 in series with inverter V5, and instead includes a tunable inverter V6 coupled in series with tunable inverter V3 at a node NS between node NI and node NO. In some embodiments, tunable inverter V6 is tunable inverter 500 discussed below with respect to FIG. 5 or one of tunable inverters 800A or 800B discussed below with respect to FIGS. 8A and 8B.

In the embodiment depicted in FIG. 2, tunable inverter V3 is coupled to input path PI at node NI between input terminal IN and inverter V1, and tunable inverter V6 is coupled to output path PO at node NO between output terminal OUT and inverter V5. In some embodiments, tunable inverter V3 is coupled to input path PI at node NI such that inverter V1 is between input terminal IN and node NI, and tunable inverter V6 is coupled to output path PO at node NO such that inverter V5 is between output terminal OUT and node NO.

In the manner discussed above with respect to FIG. 1, DCDL circuit 200 including control circuit 120 is configured to select an nth stage of stages 210-1 . . . 210-N as a return stage while activating each inverter V1 between input terminal IN and node NI of the selected return stage, and each inverter V5 between the selected return stage and output terminal OUT, thereby configuring a signal delay path including input path PI including the activated inverters V1, the return path including tunable inverters V3 and V6, and output path PO including the activated inverters V5, in operation.

In operation, unless stage 210-1 as depicted in FIG. 2 is selected as the return stage, inverter V1 of stage 210-1 receives a transition in signal SI at node NI and propagates the received transition along input path PI to node NI of stage 210-2 as an inverted transition delayed by the delay time of inverter V1. This propagation sequence is repeated for each activated inverter V1 along input path PI.

Tunable inverter V3 of the selected return stage receives the final transition in signal SI at node NI on input path PI, and propagates the final transition to the corresponding tunable inverter V6 at node NS as an inverted transition delayed by the delay time of tunable inverter V3, and the corresponding tunable inverter V6 propagates the inverted transition received from node NS to node NO of output path PO as a further inverted transition delayed by the delay time of tunable inverter V6. In some embodiments, DCDL circuit 200 is configured to select return path PR by activating inverters V1 and V5 of each of stages 210-1 . . . 210-N, in which case signal SI is directly propagated from input path PI to signal SO on output path PO without being delayed by the delay times of tunable inverters V3 and V6, in operation.

The delay times of tunable inverters V3 and V6 of the selected return stage correspond to the predetermined one of the active states determined by control signals SCTRL. In various embodiments, tunable inverters V3 and V6 of each of stages 210-1 . . . 210-N are configured to receive a same set of control signals SCTRL or different sets of control signals SCTRL.

In turn, the inverted transition from tunable inverter V6 of the selected return stage is propagated along output path PO by each activated inverter V5 along output path PO as an inverted transition delayed by the delay time of the corresponding inverter V5.

In operation, signal SO is thereby generated on output terminal OUT including a transition delayed relative to the transition in signal SI by a total delay time based on a sum of the delay times of each of inverters V1 in input path PI, each of inverters V5 in output path PO, and tunable inverters V3 and V6 of the selected return stage. In some embodiments in which DCDL circuit 100 includes return path PR and a stage 110-1 . . . 110-N is not selected as a return stage, the total delay time is based on a sum of the delay times of each of inverters V1 in input path PI, and the delay times of each of inverters V5 in output path PO.

In operation, the transition in signal SO has a polarity relative to the transition in signal SI based on a total number of inverters included in input path PI, output path PO, and tunable inverters V3 and V6 of the selected return stage such that an odd total number of inverters corresponds to signal SO having a transition polarity opposite that of signal SI, and an even total number of inverters corresponds to signal SO having a same transition polarity as that of signal SI.

In some embodiments, DCDL circuit 100 includes neither input buffer VBI nor output buffer VBO, and the total number of inverters is an even number equal to the sum of the number of inverters V1 included in input path PI, the number of inverters V5 included in output path PO, plus tunable inverters V3 and V6 of the selected return stage. In operation, in such embodiments, a transition in signal SI received at input terminal IN having a given polarity thereby causes signal SO at output terminal OUT to have a transition having the same polarity and delayed by a total delay time equal to the sum of the delay times of each of inverters V1 in input path PI, each of inverters V5 in output path PO, and tunable inverters V3 and V6 of the selected return stage.

In some embodiments, DCDL circuit 100 includes one of input buffer VBI or output buffer VBO, and the total number of inverters is an odd number equal to the sum of the number of inverters V1 included in input path PI, the number of inverters V5 included in output path PO, tunable inverters V3 and V6 of the selected return stage, plus the one of input buffer VBI or output buffer VBO. In operation, in such embodiments, a transition in signal SI received at input terminal IN having a given polarity thereby causes signal SO at output terminal OUT to have a transition having the opposite polarity and delayed by a total delay time equal to the sum of the delay times of each of inverters V1 in input path PI, the delay times of each of inverters V5 in output path PO, the delay times of tunable inverters V3 and V6 of the selected return stage, plus the delay time of either input buffer VBI in input path PI or output buffer VBO in output path PO.

By the configuration discussed above, tunable inverters V3 and V6 of each of stages 210-1 . . . 210-N of DCDL circuit 200 are configured to collectively receive input signals having both transition polarities. For each programmable delay time of DCDL circuit 200 based on a selected return stage, control of the delay time component contributed by the corresponding tunable inverters V3 and V6 is therefore based on switching speeds of a first plurality of p-type transistors and a second plurality of n-type transistors.

By configuring each programmable delay time to be based on tunable inverters V3 and V6 having delay times based on switching speeds of each transistor type, DCDL circuit 200 is capable of having improved delay time control, and thereby increased delay time linearity, compared to approaches in which each programmable delay time is not based on switching speeds of each transistor type.

Figure 3:
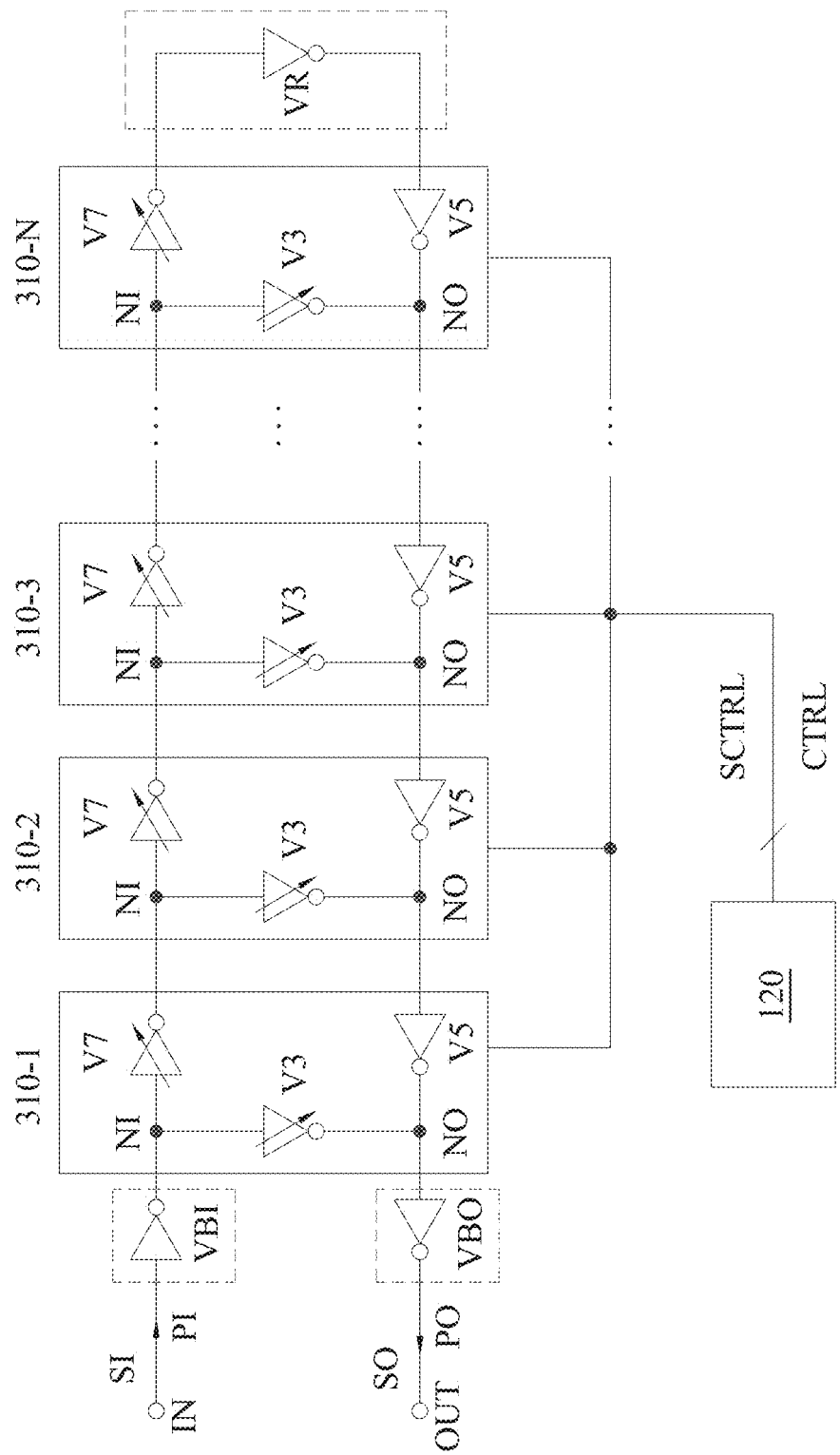
FIG. 3 is a schematic diagram of a DCDL circuit, in accordance with some embodiments.

FIG. 3 is a schematic diagram of a DCDL circuit 300, in accordance with some embodiments. DCDL circuit 300, also referred to as DCDL 300 in some embodiments, is an integrated circuit (IC) including input terminal IN, output terminal OUT, control circuit 120, control signal bus CTRL, and return inverter VR, each discussed above with respect to FIG. 1. Instead of stages 110-1 . . . 110-N, DCDL circuit 300 includes stages 310-1 . . . 310-N. In various embodiments, DCDL circuit 300 includes one of input buffer VBI or output buffer VBO, each discussed above with respect to FIG. 1. In some embodiments, DCDL circuit 300 is a portion of another circuit, e.g., DLL circuit 1100 discussed below with respect to FIG. 11.

Stages 310-1 . . . 310-N of DCDL circuit 300 are arranged in the manner discussed above with respect to FIG. 1, and DCDL 300 is thereby configured to receive signal SI at input terminal IN, and stages 310-1 . . . 310-N are configured to return signal SO at output terminal OUT by applying a programmable delay time to signal SI responsive to control signals SCTRL received on control signal bus CTRL and generated by control circuit 120. Input terminal IN along with selectable portions of stages 310-1 . . . 310-N are thereby configured as input path PI, and selectable portions of stages 310-1 . . . 310-N along with output terminal OUT are thereby configured as output path PO.

Each of stages 310-1 . . . 310-N includes nodes NI and NO, inverter V5, and tunable inverter V3, each discussed above with respect to FIG. 1. Compared to stages 110-1 . . . 110-N, each of stages 310-1 . . . 310-N does not include inverter V4 in series with inverter V5, and includes a tunable inverter V7 instead of inverters V1 and V2. In some embodiments, tunable inverter V7 is tunable inverter 500 discussed below with respect to FIG. 5 or one of tunable inverters 800A or 800B discussed below with respect to FIGS. 8A and 8B.

In the embodiment depicted in FIG. 3, tunable inverter V3 is coupled to input path PI at node NI between input terminal IN and tunable inverter V7, and coupled to output path PO at node NO between output terminal OUT and inverter V5. In some embodiments, tunable inverter V3 is coupled to input path PI at node NI such that tunable inverter V7 is between input terminal IN and node NI, and coupled to output path PO at node NO such that inverter V5 is between output terminal OUT and node NO.

In the manner discussed above with respect to FIG. 1, DCDL circuit 300 including control circuit 120 is configured to select an nth stage of stages 310-1 . . . 310-N as a return stage (or return inverter VR in some embodiments) while activating each tunable inverter V7 between input terminal IN and node NI of the selected return stage, and each inverter V5 between the selected return stage and output terminal OUT, thereby configuring a signal delay path including input path PI including the activated tunable inverters V7, the return path including tunable inverter V3 (or return inverter VR), and output path PO including the activated inverters V5, in operation.

In operation, unless stage 310-1 as depicted in FIG. 3 is selected as the return stage, tunable inverter V7 of stage 310-1 receives a transition in signal SI at node NI and propagates the received transition along input path PI to node NI of stage 310-2 as an inverted transition delayed by the delay time of tunable inverter V7. This propagation sequence is repeated for each activated tunable inverter V7 along input path PI.

Tunable inverter V3 of the selected return stage (or return inverter VR) receives the final transition in signal SI at node NI on input path PI, and propagates the final transition to node NO of output path PO as an inverted transition delayed by the delay time of tunable inverter V3.

The delay times of tunable inverters V7 of input path PI and tunable inverter V3 of the selected return stage correspond to predetermined ones of the active states determined by control signals SCTRL (or a delay time of return inverter VR instead of that of tunable inverter V3).

In turn, the inverted transition from tunable inverter V3 of the selected return stage is propagated along output path PO by each activated inverter V5 along output path PO as an inverted transition delayed by the delay time of the corresponding inverter V5.

In operation, signal SO is thereby generated on output terminal OUT including a transition delayed relative to the transition in signal SI by a total delay time based on a sum of the delay times of each of tunable inverters V7 in input path PI, each of inverters V5 in output path PO, and tunable inverter V3 of the selected return stage (or return inverter VR). The transition in signal SO has a polarity relative to the transition in signal SI based on a total number of inverters included in input path PI, output path PO, and tunable inverter V3 of the selected return stage (or return inverter VR) such that an odd total number of inverters corresponds to signal SO having a transition polarity opposite that of signal SI, and an even total number of inverters corresponds to signal SO having a same transition polarity as that of signal SI.

In some embodiments, DCDL circuit 300 includes neither input buffer VBI nor output buffer VBO, and the total number of inverters is an odd number equal to the sum of the number of tunable inverters V7 included in input path PI, the number of inverters V5 included in output path PO, plus tunable inverter V3 selected return stage (or return inverter VR). In operation, in such embodiments, a transition in signal SI received at input terminal IN having a given polarity thereby causes signal SO at output terminal OUT to have a transition having the opposite polarity and delayed by a total delay time equal to the sum of the delay times of each of tunable inverters V7 in input path PI, each of inverters V5 in output path PO, and tunable inverter V3 of the selected return stage (or return inverter VR).

In some embodiments, DCDL circuit 300 includes one of input buffer VBI or output buffer VBO, and the total number of inverters is an even number equal to the sum of the number of tunable inverters V7 included in input path PI, the number of inverters V5 included in output path PO, tunable inverter V3 of the selected return stage (or return inverter VR), plus the one of input buffer VBI or output buffer VBO. In operation, in such embodiments, a transition in signal SI received at input terminal IN having a given polarity thereby causes signal SO at output terminal OUT to have a transition having the same polarity and delayed by a total delay time equal to the sum of the delay times of each of tunable inverters V7 in input path PI, the delay times of each of inverters V5 in output path PO, the delay time of tunable inverter V3 of the selected return stage (or return inverter VR), plus the delay time of either input buffer VBI in input path PI or output buffer VBO in output path PO.

By the configuration discussed above, tunable inverter V3 of each of stages 310-2 . . . 310-N of DCDL circuit 300 and tunable inverter V7 of each corresponding sequentially coupled stage 310-1 . . . 310-N-1 are configured to collectively receive input signals having both transition polarities. For each programmable delay time of DCDL circuit 300 based on a return stage selected from stages 310-2 . . . 310-N, control of the delay time component contributed by the corresponding tunable inverters V3 and V7 is therefore based on switching speeds of a first plurality of p-type transistors and a second plurality of n-type transistors.

By configuring each programmable delay time within a range corresponding to stages 310-2 . . . 310-N to be based on tunable inverters V3 and V6 having delay times based on switching speeds of each transistor type, DCDL circuit 300 is capable of having improved delay time control, and thereby increased delay time linearity, compared to approaches in which each programmable delay time within a corresponding range is not based on switching speeds of each transistor type.

Figure 4:
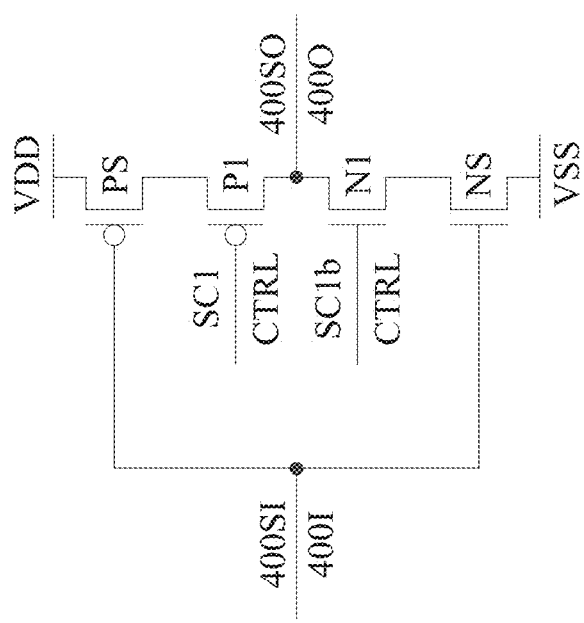
FIG. 4 is a schematic diagram of an inverter, in accordance with some embodiments.

FIG. 4 is a schematic diagram of tristate inverter 400, in accordance with some embodiments. Tristate inverter 400 is usable as one or more of inverters V1, V2, V4, or V5 discussed above with respect to FIGS. 1-3 and below with respect to FIGS. 9A-9D.

Tristate inverter 400 includes a power supply node VDD configured to carry a power supply voltage (not labeled), a reference node VSS configured to carry a reference, e.g., ground, voltage (not labeled), a complementary transistor pair PS/NS, and a complementary transistor pair P1/N1.

P-type transistor PS is coupled to power supply node VDD, n-type transistor NS is coupled to reference node VSS, and a gate of each of transistors PS and NS is coupled to an input terminal 4001 configured to receive an input signal 400SI.

P-type transistor P1 and n-type transistor N1 are coupled in series between complementary transistor pair PS/NS, a gate of each of transistors P1 and N1 is coupled to control signal bus CTRL discussed above with respect to FIG. 1, and source terminals of transistors P1 and N1 are coupled together at an output terminal 4000. The gate of transistor P1 is configured to receive a control signal SC1 and the gate of transistor N1 is configured to receive a control signal SC1b complementary to control signal SC1, control signals SC1 and SC1b being a set of control signals SCTRL generated by control circuit 120, discussed above with respect to FIGS. 1-3.

In operation, transistors P1 and N1 are thereby configured to be switched off in response to control signal SC1 having the high voltage level and control signal SC1b having the low voltage level, corresponding to the inactivated state of tristate inverter 400 discussed above with respect to FIGS. 1-3. In response to control signal SC1 having the low voltage level and control signal SC1b having the high voltage level, transistors P1 and N1 are switched on in operation, corresponding to the activated state discussed above in which tristate inverter 400 is configured to generate output signal 400SO on output node 400O complementary to input signal 400SI and having a delay time corresponding to switching speeds of transistors PS, P1, NS, and N1.

A DCDL circuit 100-300 or 900A-900D including tristate inverter 400 as discussed above with respect to FIGS. 1-3 and below with respect to FIGS. 9A-9D, is thereby capable of generating a total delay time including the tristate inverter 400 delay time having the benefits discussed above with respect to DCDL circuits 100-300 and below with respect to DCDL circuits 900A-900D.

Figure 5:
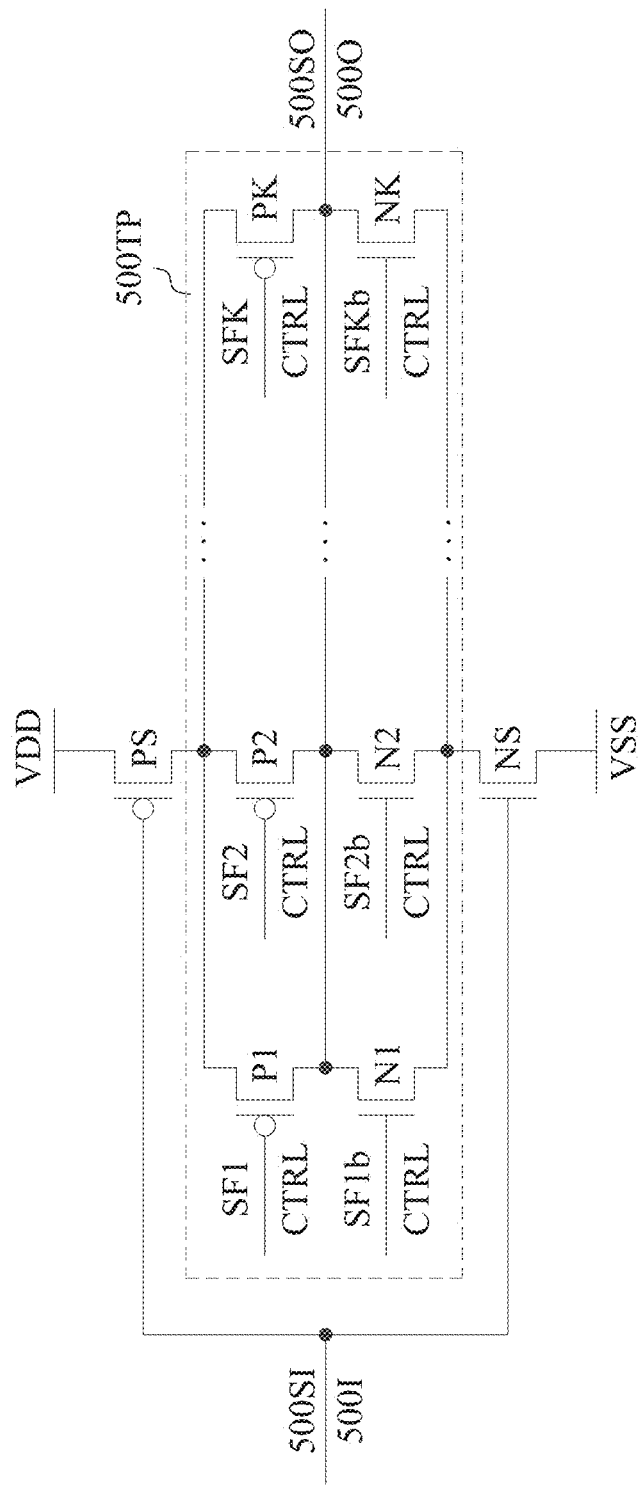
FIG. 5 is a schematic diagram of a tunable inverter, in accordance with some embodiments.

FIG. 5 is a schematic diagram of tunable inverter 500, in accordance with some embodiments. Tunable inverter 500 is usable as one or more of tunable inverters V3, V6, or V7 discussed above with respect to FIGS. 1-3.

Tunable inverter 500 includes power supply node VDD, reference node VSS, and complementary transistor pairs PS/NS and P1/N1 arranged as discussed above with respect to FIG. 4. A gate of each of transistors PS and NS is coupled to an input terminal 5001 configured to receive an input signal 500SI, and source terminals of transistors P1 and N1 are coupled to an output terminal 500O.

Transistor P1 is one p-type transistor of a number K of p-type transistors P1-PK arranged in parallel in a tuning portion 500TP, and transistor N1 is one n-type transistor of the number K of n-type transistors N1-NK arranged in parallel in tuning portion 500TP. Gates of each of transistors P1-PK and N1-NK are coupled to control signal bus CTRL discussed above with respect to FIGS. 1-4, transistors P1-PK are thereby configured to receive control signals SF1-SFK, and transistors N1-NK are thereby configured to receive control signals SF1b-SFKb complementary to respective control signals SF1-SFK, control signals SF1-SFK and SF1b-SFKb being a set of control signals SCTRL generated by control circuit 120, discussed above with respect to FIGS. 1-4.

In various embodiments, the number K is equal to two such that tunable inverter 500 includes totals of two p-type and two n-type transistors in tuning portion 500TP, the number K is equal to three such that tunable inverter 500 includes totals of three p-type and three n-type transistors in tuning portion 500TP, or the number K is greater than three such that tunable inverter 500 includes totals of more than three of each of p-type transistors and n-type transistors in tuning portion 500TP.

In operation, pairs of transistors P1-PK and corresponding transistors N1-NK are thereby configured to be switched off in response to the corresponding control signal SF1-SFK having a high voltage level and corresponding control signal SF1b-SFKb having a low voltage level, corresponding to the inactivated state of a tunable inverter discussed above with respect to FIGS. 1-4. In response to a given one of control signals SF1-SFK having the low voltage level and the corresponding control signal SF1b-SFKb having the high voltage level, the corresponding transistor pair of transistors P1-PK and N1-NK are switched on in operation. Varying combinations of control signals SF1-SFK having the low voltage level and corresponding control signals SF1b-SFKb having the high voltage level thereby correspond to the plurality of activated states discussed above in which tunable inverter 500 is configured to generate output signal 500SO on output node 500O complementary to input signal 500SI and having delay times corresponding to switching speeds of some or all of pairs of transistors P1-PK and N1-NK.

A DCDL circuit 100-300 including tunable inverter 500 as discussed above with respect to FIGS. 1-3 is thereby capable generating a total delay time including the plurality of tunable inverter 500 delay times having the benefits discussed above with respect to DCDL circuits 100-300.

FIG. 6 is a flowchart of a method 600 of controlling a signal delay time, in accordance with one or more embodiments. Method 600 is usable with a DCDL circuit, e.g., a DCDL circuit 100-300 discussed above with respect to respective FIGS. 1-3.

The sequence in which the operations of method 600 are depicted in FIG. 6 is for illustration only; the operations of method 600 are capable of being executed in sequences that differ from that depicted in FIG. 6. In some embodiments, operations in addition to those depicted in FIG. 6 are performed before, between, during, and/or after the operations depicted in FIG. 6. In some embodiments, the operations of method 600 are part of operating a circuit, e.g., DLL circuit 1100 discussed below with respect to FIG. 11.

At operation 610, in some embodiments, a first signal is received at a first stage of a plurality of sequentially coupled stages of a DCDL. In some embodiments, receiving the first signal at the first stage of the plurality of sequentially coupled stages includes receiving the first signal at an input terminal of the DCDL. In some embodiments, receiving the first signal at the first stage of the plurality of sequentially coupled stages includes receiving signal SI at input terminal IN of one of DCDL circuits 100-300 discussed above with respect to FIGS. 1-3.

In various embodiments, receiving the first signal at the first stage of the plurality of sequentially coupled stages includes receiving the first signal at a tristate inverter or a tunable inverter of the first stage of the plurality of sequentially coupled stages. In some embodiments, receiving the first signal at the first stage of the plurality of sequentially coupled stages includes receiving the first signal at inverter V1 of stage 110-1 of DCDL circuit 100 discussed above with respect to FIG. 1 or stage 210-1 of DCDL circuit 200 discussed above with respect to FIG. 2. In some embodiments, receiving the first signal at the first stage of the plurality of sequentially coupled stages includes receiving the first signal at tunable inverter V7 of stage 310-1 of DCDL circuit 300 discussed above with respect to FIG. 3.

In some embodiments, receiving the first signal at the first stage of the plurality of sequentially coupled stages includes receiving the first signal from an input buffer. In some embodiments, receiving the first signal at the first stage of the plurality of sequentially coupled stages includes receiving the first signal from input buffer VBI of one of DCDL circuits 100-300 discussed above with respect to FIGS. 1-3.

At operation 620, a second stage of the plurality of sequentially coupled stages is selected as a return stage, thereby activating a tunable inverter of the second stage as part of a signal delay path of the DCDL. For each stage of the plurality of sequentially coupled stages, selecting the second stage includes activating a given tunable inverter in the signal delay path configured to receive a signal transition having a same polarity as a polarity of a signal transition of the input signal, the given tunable inverter being the first tunable inverter of the second stage or another activated tunable inverter.

Activating the first tunable inverter of the second stage includes activating the first tunable inverter coupled between a first signal path of the signal delay path and a second signal path of the signal delay path. In various embodiments, activating the first tunable inverter of the second stage includes activating tunable inverter V3 coupled between node NI of the selected return stage in signal path PI and node NO of the selected return stage in signal path PO as discussed above with respect to FIGS. 1-3.

In some embodiments, selecting the second stage of the plurality of sequentially coupled stages as the return stage includes activating two tristate inverters of the first stage as part of the first signal path and two tristate inverters of the first stage as part of the second signal path, and activating the given tunable inverter includes activating the first tunable inverter of the second stage. In some embodiments, selecting the second stage of the plurality of sequentially coupled stages as the return stage includes activating inverters V1 and V2 of stage 110-1 as part of signal path PI and inverters V4 and V5 of stage 110-1 as part of signal path PO, and activating the given tunable inverter includes activating tunable inverter V3 of the one of stages 110-2 . . . 110-N selected as the return stage, as discussed above with respect to FIG. 1.

In some embodiments, selecting the second stage of the plurality of sequentially coupled stages as the return stage includes activating a second tunable inverter of the second stage coupled in series with the first tunable inverter between the first signal path and the second signal path, and activating the given tunable inverter includes activating one of the first tunable inverter or the second tunable inverter. In some embodiments, selecting the second stage of the plurality of sequentially coupled stages as the return stage includes activating tunable inverter V6 coupled in series with tunable inverter V3 between signal path PI and signal path PO, and activating the given tunable inverter includes activating one tunable inverter V3 or V6 of the one of stages 210-1 . . . 210-N selected as the return stage, as discussed above with respect to FIG. 2.

In some embodiments in which receiving the input signal at the first stage of the plurality of sequentially coupled stages includes receiving the input signal at a tunable inverter of the first stage of the plurality of sequentially coupled stages in operation 610, selecting the second stage of the plurality of sequentially coupled stages as the return stage includes activating the tunable inverter of the first stage of the plurality of sequentially coupled stages as part of the first signal path. In some embodiments in which receiving the input signal at the first stage of the plurality of sequentially coupled stages includes receiving the input signal at a tunable inverter of the first stage of the plurality of sequentially coupled stages in operation 610, selecting the second stage of the plurality of sequentially coupled stages as the return stage includes activating tunable inverter V7 of stage 310-1 as part of signal path PI, as discussed above with respect to FIG. 3.

At operation 630, in some embodiments, a second signal is output from the first stage of the plurality of sequentially coupled stages of the DCDL. Outputting the second signal includes outputting the second signal including a transition having a delay time relative to the transition in the first signal based on the selecting the second stage of the plurality of sequentially coupled stages in operation 620. In various embodiments, outputting the second signal including the transition includes the transition having a polarity the same as or opposite the polarity of the transition in the first signal.

In some embodiments, outputting the second signal from the first stage of the plurality of sequentially coupled stages includes outputting the second signal from an output terminal of the DCDL. In some embodiments, outputting the second signal from the first stage of the plurality of sequentially coupled stages includes outputting signal SO to output terminal OUT of one of DCDL circuits 100-300 discussed above with respect to FIGS. 1-3.

In some embodiments, outputting the second signal from the first stage of the plurality of sequentially coupled stages includes outputting the second signal from a tristate inverter of the first stage of the plurality of sequentially coupled stages. In some embodiments, outputting the second signal from the first stage of the plurality of sequentially coupled stages includes outputting signal SO from inverter V4 of stage 110-1 of DCDL circuit 100 discussed above with respect to FIG. 1. In some embodiments, outputting the second signal from the first stage of the plurality of sequentially coupled stages includes outputting signal SO from inverter V5 of stage 210-1 of DCDL circuit 200 discussed above with respect to FIG. 2 or stage 310-1 of DCDL circuit 300 discussed above with respect to FIG. 3.

In some embodiments, outputting the second signal from the first stage of the plurality of sequentially coupled stages includes outputting the second signal to an output buffer. In some embodiments, outputting the second signal from the first stage of the plurality of sequentially coupled stages includes outputting the second signal to output buffer VBO of one of DCDL circuits 100-300 discussed above with respect to FIGS. 1-3.

By executing some or all of the operations of method 600, a signal delay time is controlled by causing each signal path of a DCDL circuit corresponding to a range of programmable delay times to include a tunable delay cell that receives a signal transition having a polarity the same as that of a signal transition received by the DCDL circuit, thereby obtaining the benefits discussed above with respect to DCDL circuits 100-300.

Figure 7:
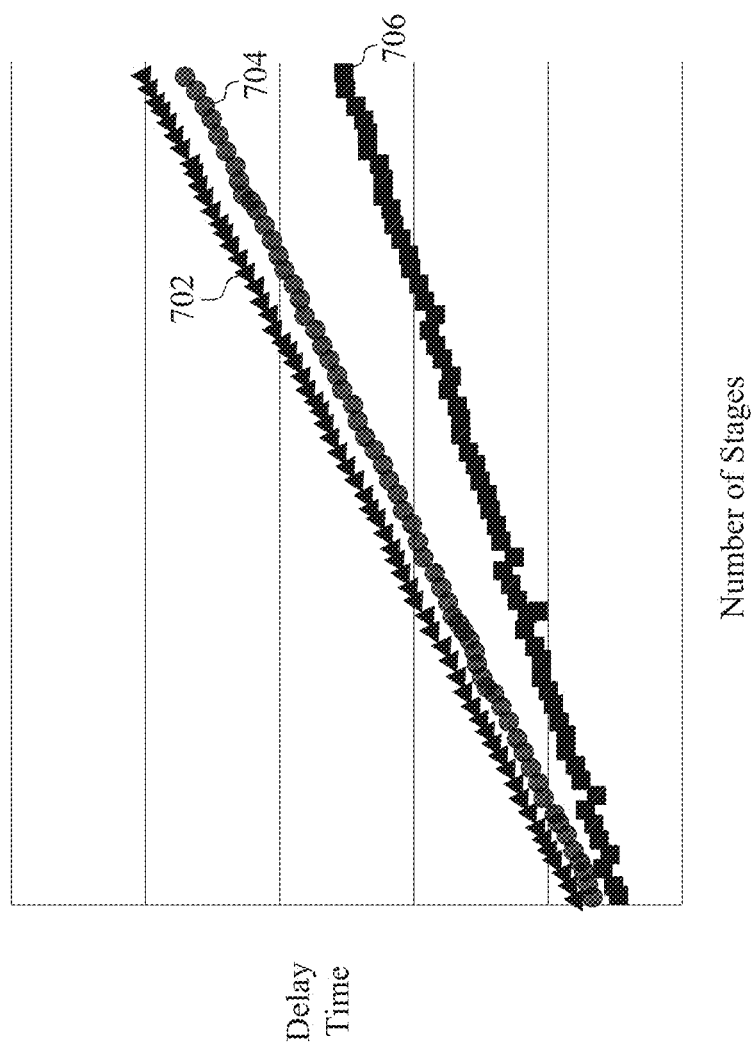
FIG. 7 is a representation of DCDL circuit operating parameters, in accordance with some embodiments.

FIG. 7 is a representation of DCDL circuit operating parameters, in accordance with some embodiments. FIG. 7 includes a horizontal axis corresponding to a number of DCDL stages included in a signal delay path and a vertical axis corresponding to delay times associated with the number of stages.

Each of curves 702, 704, and 706 is based on a circuit simulation and represents linearity of the delay times with respect to the number of stages for a TT process variation case in which both n-type and p-type transistors have target speed properties. Curve 702 is a non-limiting example based on DCDL circuit 100 discussed above with respect to FIG. 1, curve 704 is a non-limiting example based on DCDL circuit 200 discussed above with respect to FIG. 2, and curve 706 represents a DCDL circuit that does not include, for each signal path within the range of number of stages, a tunable delay cell that receives a signal transition having a polarity the same as that of a signal transition received by the DCDL circuit.

As depicted in FIG. 7, each of curves 702 and 704 indicates an increased linearity compared to curve 706. In some embodiments, for the TT process variation case, a differential nonlinearity (DNL) of each of curves 702 and 704 is reduced from a DNL of curve 706 by greater than a factor of three. In some embodiments, based on simulation of fast-slow (FS) and slow-fast (SF) process variation cases, DNL of curves equivalent to 702 and 704 is reduced by approximately one half.

Figure 8A:
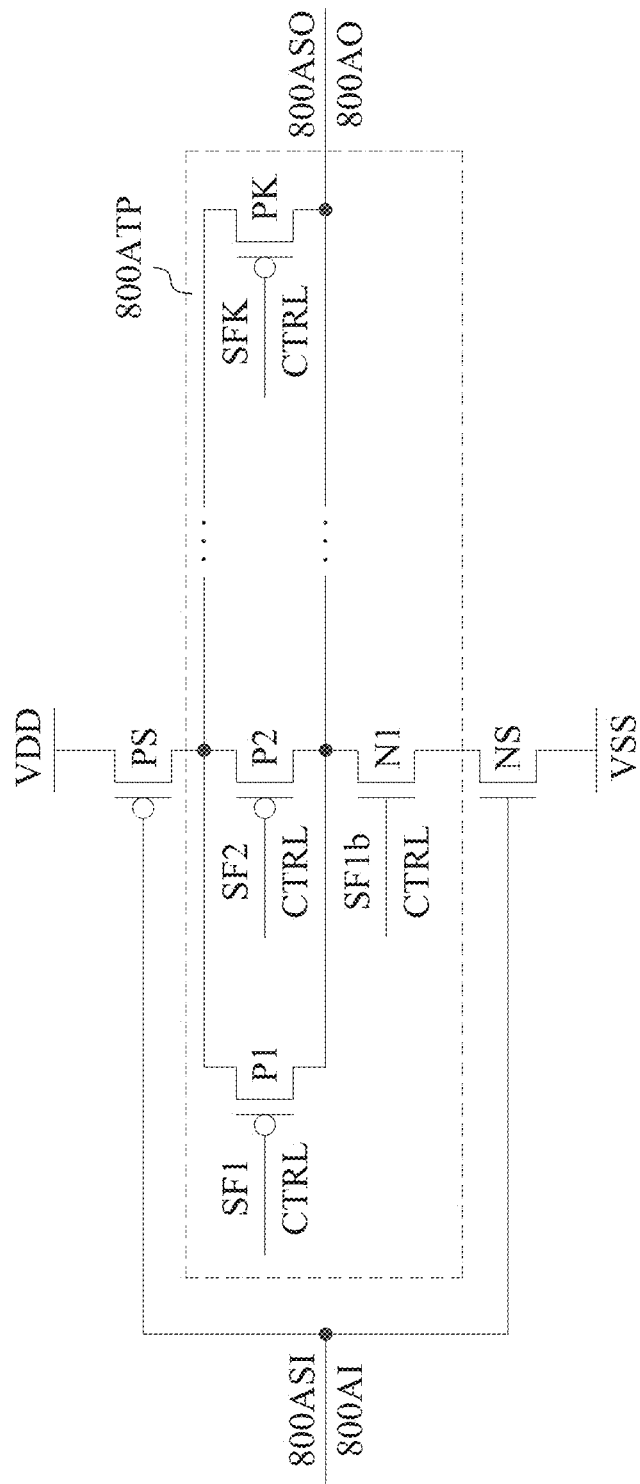
FIGS. 8A and 8B are schematic diagrams of tunable inverters, in accordance with some embodiments.
Figure 8B:
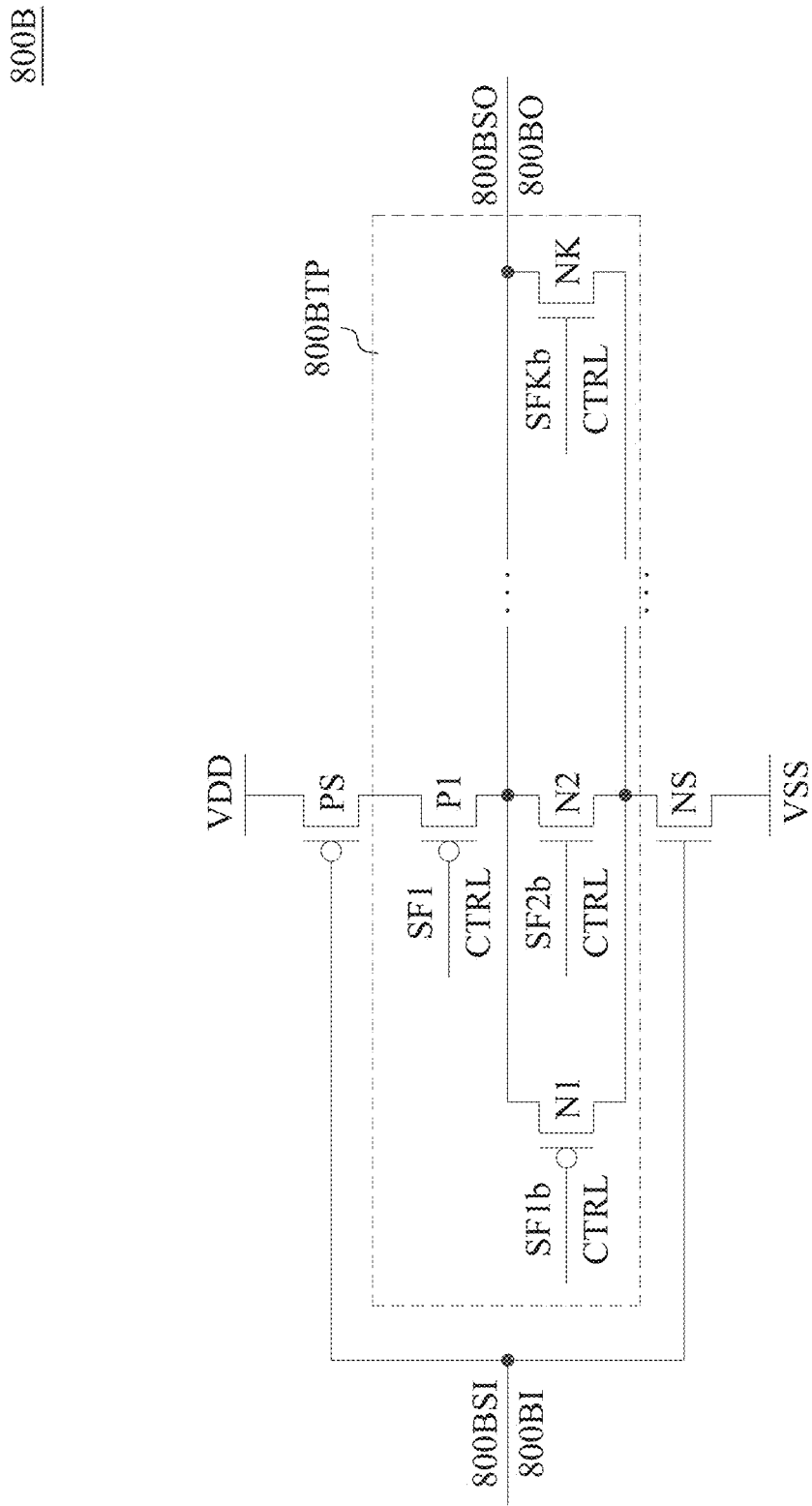

FIGS. 8A and 8B are schematic diagrams of respective tunable inverters 800A and 800B, in accordance with some embodiments. Each of tunable inverters 800A and 800B includes a subset of the elements of tunable inverter 500 discussed above with respect to FIG. 5.

As depicted in FIG. 8A, tunable inverter 800A includes power supply node VDD, reference node VSS, complementary transistor pairs PS/NS, p-type transistors P1-PK, and n-type transistor N1 arranged as discussed above with respect to FIG. 5. A gate of each of transistors PS and NS is coupled to an input terminal 800AI configured to receive an input signal 800ASI, and source terminals of transistors P1-PK and N1 are coupled to an output terminal 800AO.

Gates of each of transistors P1-PK and N1 are coupled to control signal bus CTRL and thereby configured to receive and, in operation, respond to a set of control signals SCTRL including control signals SF1-SFK and SF1$b$ in the manner discussed above with respect to FIG. 5. A tuning portion 800ATP thereby includes the number K of p-type transistors P1-PK and a single n-type transistor N1.

In operation, transistors P1-PK and N1 are thereby configured to be switched off in response to the corresponding control signals SF1-SFK having the high voltage level and control signal SF1$b$ having the low voltage level, corresponding to the inactivated state of tunable inverter 500 discussed above with respect to FIG. 5. In response to control signals SF1 and SF1$b$ having the respective low and high voltage levels, transistor pair P1/N1 is switched on in operation. In response to a given one of control signals SF2-SFK having the low voltage level, the corresponding transistor P2-PK is switched on in operation. Varying combinations of control signals SF1-SFK having the low voltage level and control signal SF1$b$ having the high voltage level thereby correspond to the plurality of activated states discussed above in which tunable inverter 800A is configured to generate output signal 800ASO on output node 800AO complementary to input signal 800ASI and having delay times corresponding to switching speeds of some or all of transistors P1-PK and N1.

As discussed above with respect to FIG. 1, delay time control is based on n-type transistor switching speed when responding to a rising input signal transition and based on p-type transistor switching speed when responding to a falling input signal transition. Tunable inverter 800A is thereby configured as a single-sided tunable inverter, also referred to as a single-sided tunable delay cell in some embodiments, in which the set of control signals SCTRL is configured to implement a plurality of programmable delay times corresponding to a falling edge of input signal 800ASI, and a single delay time corresponding to a rising edge of input signal 800ASI.

As depicted in FIG. 8B, tunable inverter 800B includes power supply node VDD, reference node VSS, complementary transistor pairs PS/NS, p-type transistor P1, and n-type transistors N1-NK arranged as discussed above with respect to FIG. 5. A gate of each of transistors PS and NS is coupled to an input terminal 800BI configured to receive an input signal 800BSI, and source terminals of transistors P1 and N1-NK are coupled to an output terminal 800BO.

Gates of each of transistors P1 and N1-NK are coupled to control signal bus CTRL and thereby configured to receive and, in operation, respond to a set of control signals SCTRL including control signals SF1 and SF1$b$-SFK$b$ in the manner discussed above with respect to FIG. 5. A tuning portion 800BTP thereby includes a single p-type transistor P1 and the number K of n-type transistors N1-NK.

In operation, transistors P1 and N1-NK are thereby configured to be switched off in response to control signal SF1 having the high voltage level and the corresponding control signals SF1b-SFKb having the low voltage level, corresponding to the inactivated state of tunable inverter 500 discussed above with respect to FIG. 5. In response to control signals SF1 and SF1b having the respective low and high voltage levels, transistor pair P1/N1 is switched on in operation. In response to a given one of control signals SF2b-SFKb having the high voltage level, the corresponding transistor N2-NK is switched on in operation. Control signal SF1 having the low voltage level and varying combinations of control signals SF1b-SFKb having the high voltage level thereby correspond to the plurality of activated states discussed above in which tunable inverter 800B is configured to generate output signal 800BSO on output node 800BO complementary to input signal 800BSI and having delay times corresponding to switching speeds of some or all of transistors P1 and N1-NK.

Tunable inverter 800B is thereby configured as a single-sided tunable inverter, also referred to as a single-sided tunable delay cell in some embodiments, in which the set of control signals SCTRL is configured to implement a plurality of programmable delay times corresponding to a rising edge of input signal 800BSI, and a single delay time corresponding to a falling edge of input signal 800BSI.

A DCDL circuit 100-300 including one or more of tunable inverters 800A or 800B as discussed above with respect to FIGS. 1-3 is thereby capable generating a total delay time including the plurality of delay times of the corresponding tunable inverter 800A or 800B having the benefits discussed above with respect to DCDL circuits 100-300.

Further, a DCDL circuit, e.g., one of DCDL circuits discussed below with respect to FIGS. 9A-9D, including one or more of single-sided tunable delay cells 800A or 800B configured to implement programmable delay times for corresponding falling or rising input signal transitions uses fewer transistors than approaches in which tunable delay cells are configured to implement programmable delay times for both rising and falling signal transitions, thereby reducing circuit size, complexity, and process variation effects.

FIGS. 9A-9D are schematic diagrams of respective DCDL circuits 900A-900D, in accordance with some embodiments. Each of DCDL circuits 900A-900D includes one or both of tunable inverters 800A or 800B discussed above with respect to FIGS. 8A and 8B, as further discussed below.

DCDL circuit 900A corresponds to DCDL circuit 100, discussed above with respect to FIG. 1, in which stages 110-1 . . . 110-N are replaced by stages 910A-1 . . . 910A-N including one of tunable inverters 800A or 800B instead of tunable inverter V3. In various embodiments, each of stages 910A-1 . . . 910A-N includes either tunable inverter 800A configured to have a plurality of delay times corresponding to a falling transition in a corresponding input signal, or tunable inverter 800B configured to have a plurality of delay times corresponding to a rising transition in a corresponding input signal.

Figure 9A:
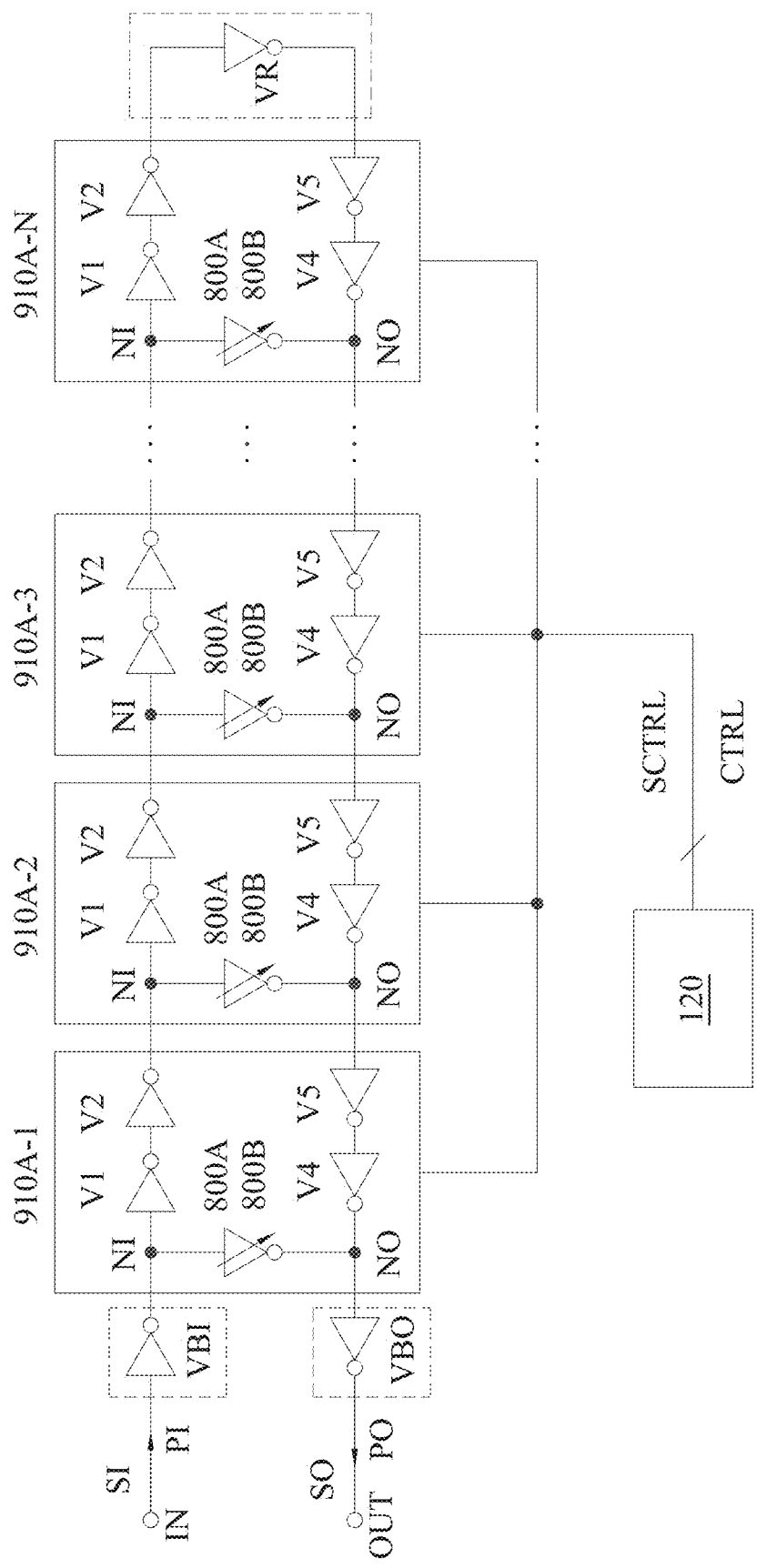
FIGS. 9A-9D are schematic diagrams of DCDL circuits, in accordance with some embodiments.

In the embodiment depicted in FIG. 9A, each of stages 910A-1 . . . 910A-N includes one of tunable inverter 800A or 800B. In various embodiments, one or more of stages 910A-1 . . . 910A-N includes one of tunable inverter 800A or 800B and one or more of stages 910A-1 . . . 910A-N includes tunable inverter V3.

DCDL circuit 900B corresponds to DCDL circuit 200, discussed above with respect to FIG. 2, in which stages 210-1 . . . 210-N are replaced by stages 910B-1 . . . 910B-N including one each of tunable inverters 800A and 800B instead of tunable inverters V3 and V6. In the embodiment depicted in FIG. 9B, each odd numbered stage 910B-1-910B-N includes tunable inverter 800A configured to have a plurality of delay times corresponding to a falling transition in a corresponding input signal on node NI and tunable inverter 800B configured to have a plurality of delay times corresponding to a rising transition in a corresponding input signal on node NS, and each even numbered stage 910B-1-910B-N includes tunable inverter 800B configured to have a plurality of delay times corresponding to a rising transition in a corresponding input signal on node NI and tunable inverter 800A configured to have a plurality of delay times corresponding to a falling transition in a corresponding input signal on node NS. In some embodiments, DCDL circuit 900B includes a complementary configuration of tunable inverters 800A and 800B.

Figure 9B:
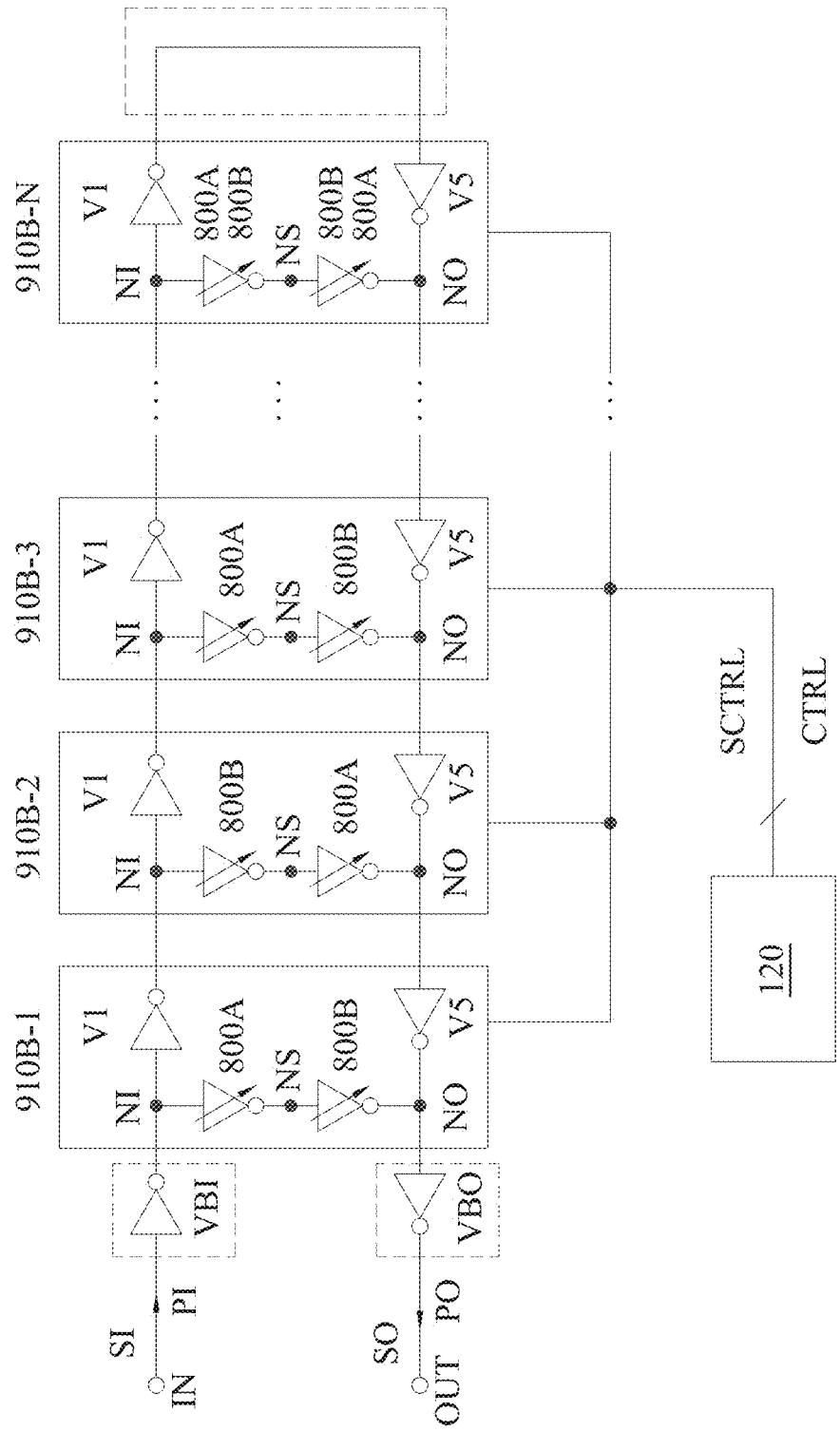

In the embodiment depicted in FIG. 9B, each of stages 910B-1 . . . 910B-N includes each of tunable inverters 800A and 800B. In various embodiments, stages 910B-1 . . . 910B-N include combinations of tunable inverters 800A, 800B, V3 and V6 other than those depicted in FIG. 9B such that at least one of stages 910B-1 . . . 910B-N includes a tunable inverter 800A or 800B configured as discussed above.

DCDL circuit 900C corresponds to DCDL circuit 300, discussed above with respect to FIG. 3, in which stages 310-1 . . . 310-N are replaced by stages 910C-1 . . . 910C-N including two each of either tunable inverter 800A or tunable inverter 800B instead of tunable inverters V3 and V7. In the embodiment depicted in FIG. 9C, each odd numbered stage 910C-1-910C-N includes two instances of tunable inverter 800A configured to have a plurality of delay times corresponding to a falling transition in a corresponding input signal on node NI, and each even numbered stage 910C-1-910C-N includes two instances of tunable inverter 800C configured to have a plurality of delay times corresponding to a rising transition in a corresponding input signal on node NI. In some embodiments, DCDL circuit 900C includes a complementary configuration of tunable inverters 800A and 800B.

Figure 9C:
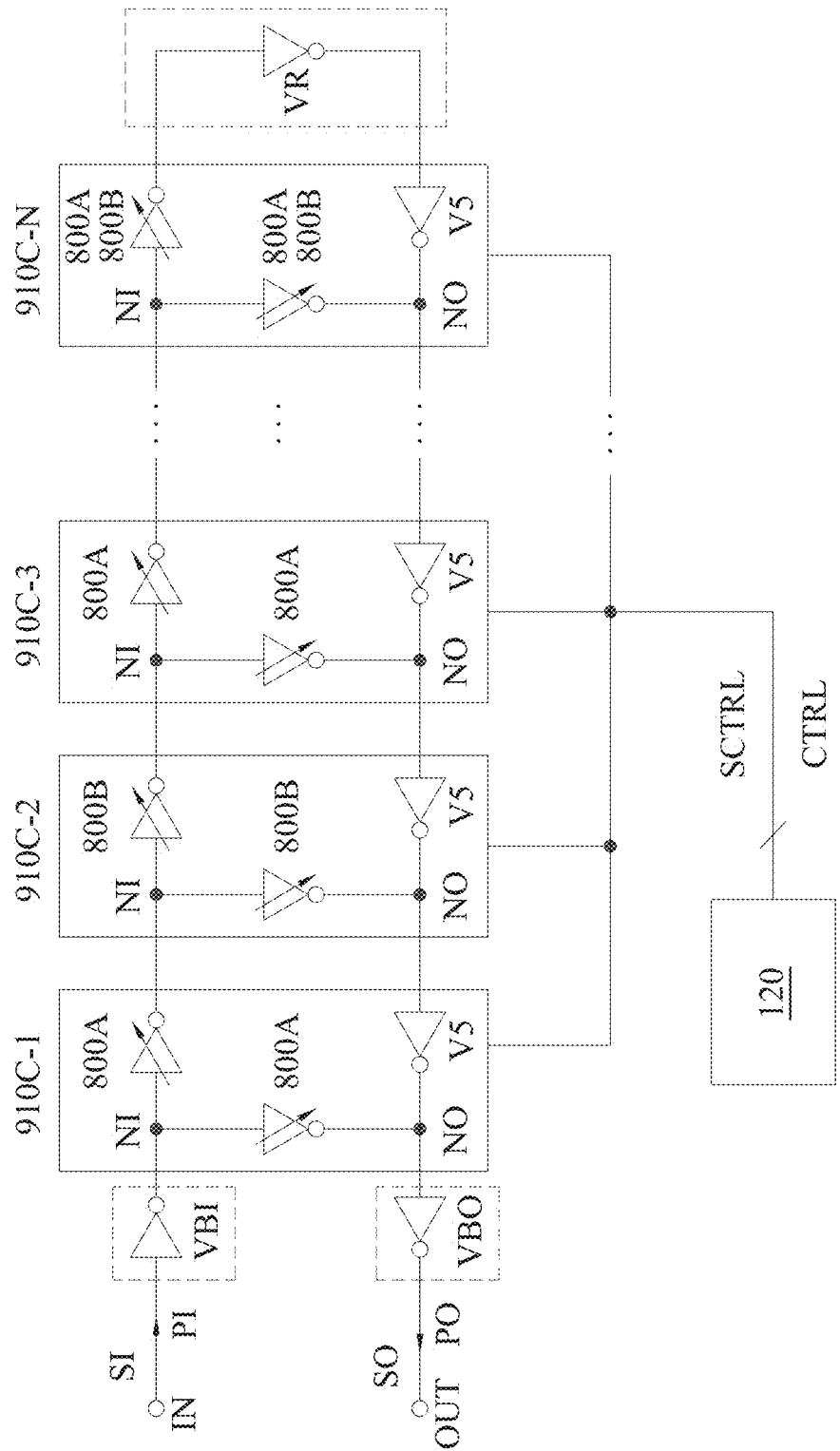

In the embodiment depicted in FIG. 9C, each of stages 910C-1 . . . 910C-N includes two each of either tunable inverter 800A or tunable inverter 800B. In various embodiments, stages 910C-1 . . . 910C-N include combinations of tunable inverters 800A, 800B, V3 and V7 other than those depicted in FIG. 9C such that at least one of stages 910C-1 . . . 910C-N includes a tunable inverter 800A or 800B configured as discussed above.

DCDL circuit 900D is a DCDL including input terminal IN, output terminal OUT, signal paths PI and PO, control circuit 120, and control signal bus CTRL, each discussed above with respect to FIG. 1. Instead of stages 110-1 . . . 110-N, DCDL 900D includes stages 910D-1 . . . 910D-N including inverters V1 and V5 discussed above with respect to FIG. 1 and one each of either tunable inverters 800A or 800B. In the embodiment depicted in FIG. 9D, each odd numbered stage 910D-1-910D-N includes tunable inverter 800A configured to have a plurality of delay times corresponding to a falling transition in a corresponding input signal on node NI, and each even numbered stage 910D-1-910D-N includes tunable inverter 800B configured to have a plurality of delay times corresponding to a rising transition in a corresponding input signal on node NI. In some embodiments, DCDL circuit 900D includes a complementary configuration of tunable inverters 800A and 800B.

Figure 9D:
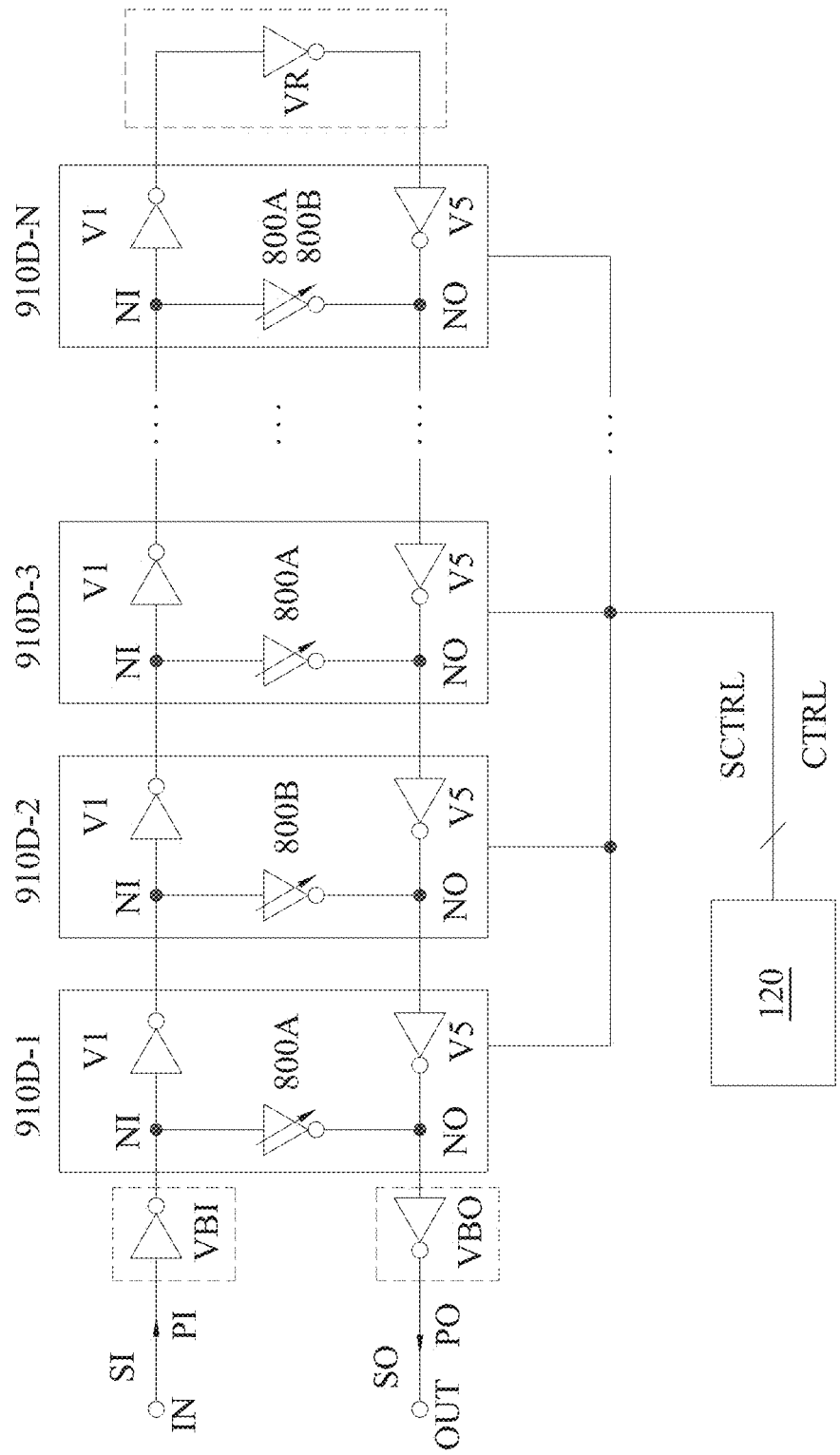

In the embodiment depicted in FIG. 9D, each of stages 910D-1 . . . 910D-N includes one of tunable inverter 800A or 800B. In various embodiments, one or more of stages 910D-1 . . . 910D-N includes one of tunable inverter 800A or 800B and one or more of stages 910D-1 . . . 910D-N instead includes another tunable inverter, e.g., tunable inverter V3 discussed above with respect to FIG. 1.

By including at least one of either tunable inverter 800A or tunable inverter 800B, each of DCDL circuits 900A-900D is configured to implement programmable delay times for corresponding falling or rising input signal transitions using fewer transistors than approaches in which tunable delay cells are configured to implement programmable delay times for both rising and falling signal transitions, thereby realizing the benefits discussed above with respect to tunable inverters 800A and 800B.

Figure 10:
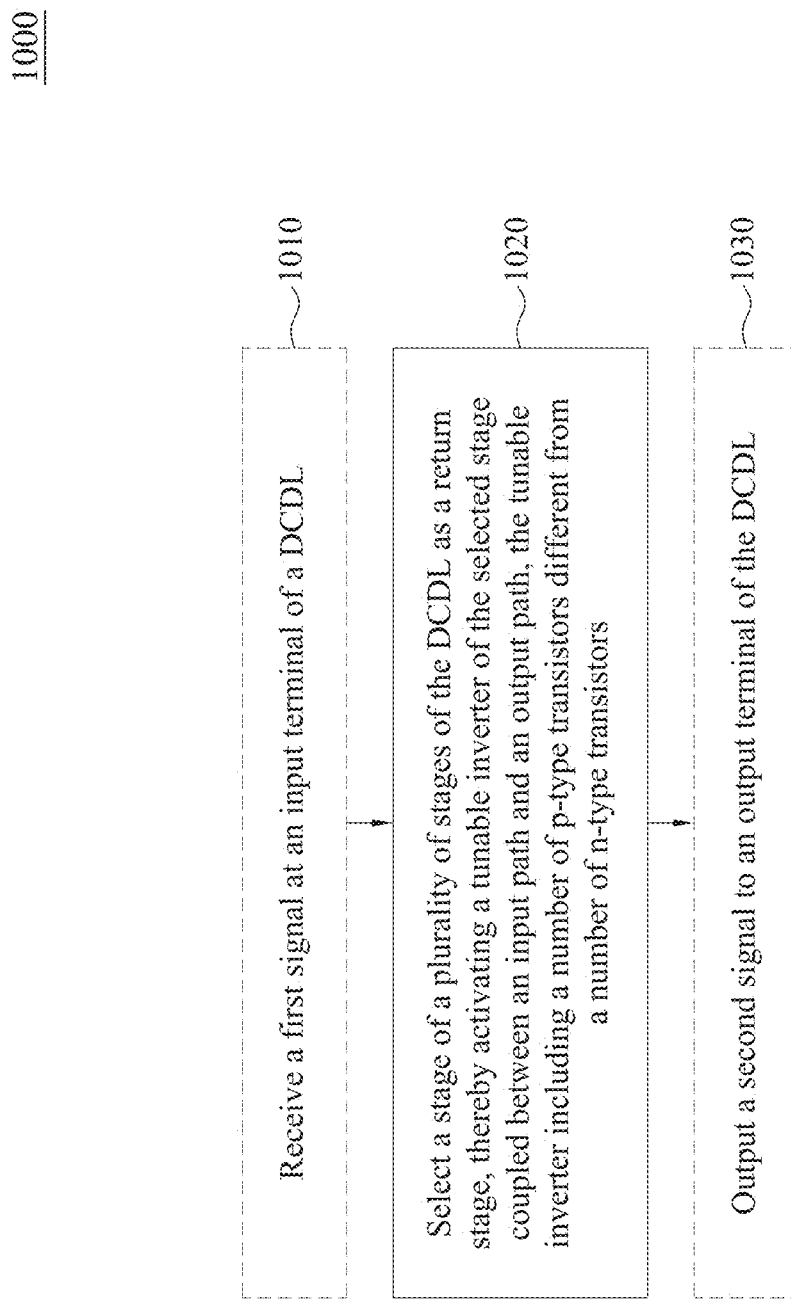
FIG. 10 is a flowchart of a method of controlling a signal delay time, in accordance with some embodiments.

FIG. 10 is a flowchart of a method 1000 of controlling a signal delay, in accordance with some embodiments. Method 1000 is usable with a DCDL circuit, e.g., a DCDL circuit 100-300 discussed above with respect to FIGS. 1-3, or a DCDL circuit 900A-900D discussed above with respect to FIGS. 9A-9D.

The sequence in which the operations of method 1000 are depicted in FIG. 10 is for illustration only; the operations of method 1000 are capable of being executed in sequences that differ from that depicted in FIG. 10. In some embodiments, operations in addition to those depicted in FIG. 10 are performed before, between, during, and/or after the operations depicted in FIG. 10. In some embodiments, the operations of method 1000 are part of operating a circuit, e.g., DLL circuit 1100 discussed below with respect to FIG. 11.

At operation 1010, in some embodiments, a first signal is received at an input terminal of a DCDL. In some embodiments, receiving the first signal at the input terminal of the DCDL includes receiving signal SI at input terminal IN of one of DCDL circuits 100-300 discussed above with respect to FIGS. 1-3 or DCDL circuits 900A-900D discussed above with respect to FIGS. 9A-9D.

In some embodiments, receiving the first signal at the input terminal of the DCDL includes receiving the first signal at an input buffer. In some embodiments, receiving the first signal at the input terminal of the DCDL includes receiving the first signal at input buffer VBI of one of DCDL circuits 100-300 discussed above with respect to FIGS. 1-3 or DCDL circuits 900A-900D discussed above with respect to FIGS. 9A-9D.

At operation 1020, a stage of a plurality of stages of the DCDL is selected as a return stage, thereby activating a tunable inverter of the selected stage coupled between an input path and an output path, the tunable inverter including a number of p-type transistors different from a number of n-type transistors.

In some embodiments, activating the tunable inverter including the number of p-type transistors different from the number of n-type transistors includes activating tunable inverter 800A including the number K of p-type transistors P1-PK and a single n-type transistor N1 as discussed above with respect to FIG. 8A. In some embodiments, activating the tunable inverter including the number of p-type transistors different from the number of n-type transistors includes activating tunable inverter 800B including a single p-type transistor P1 and the number K of n-type transistors N1-NK as discussed above with respect to FIG. 8B.

In some embodiments, activating the tunable inverter including the number of p-type transistors different from the number of n-type transistors includes activating different numbers of p-type and n-type transistors. In various embodiments, activating different numbers of p-type and n-type transistors includes activating some or all of transistors P1-PK and transistor N1 of tunable inverter 800A discussed above with respect to FIG. 8A or activating transistor P1 and some or all of transistors N1-NK of tunable inverter 800B discussed above with respect to FIG. 8B.

In various embodiments, selecting a stage of a plurality of stages of the DCDL includes selecting one of stages 110-1 . . . 110-N discussed above with respect to FIG. 1, one of stages 210-1 . . . 210-N discussed above with respect to FIG. 2, one of stages 310-1 . . . 310-N discussed above with respect to FIG. 3, one of stages 910A-1 . . . 910A-N discussed above with respect to FIG. 9A, one of stages 910B-1 . . . 910B-N discussed above with respect to FIG. 9B, one of stages 910C-1 . . . 910C-N discussed above with respect to FIG. 9C, or one of stages 910D-1 . . . 910D-N discussed above with respect to FIG. 9D.

At operation 1030, in some embodiments, a second signal is output to an output terminal of the DCDL. In some embodiments, outputting the second signal to the output terminal of the DCDL includes outputting signal SO to output terminal OUT of one of DCDL circuits 100-300 discussed above with respect to FIGS. 1-3 or DCDL circuits 900A-900D discussed above with respect to FIGS. 9A-9D.

In some embodiments, outputting the second signal to the output terminal of the DCDL includes outputting the second signal from an output buffer. In some embodiments, outputting the second signal to the output terminal of the DCDL includes outputting the second signal from output buffer VBI of one of DCDL circuits 100-300 discussed above with respect to FIGS. 1-3 or DCDL circuits 900A-900D discussed above with respect to FIGS. 9A-9D.

By executing some or all of the operations of method 1000, programmable delay times are implemented for corresponding falling or rising input signal transitions using fewer transistors than approaches in which tunable delay cells are configured to implement programmable delay times for both rising and falling signal transitions, thereby realizing the benefits discussed above with respect to tunable inverters 800A and 800B.

Figure 11:
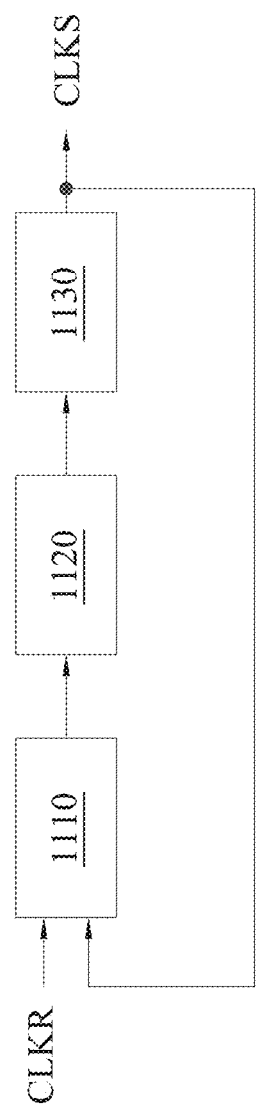
FIG. 11 is a schematic diagram of a DLL circuit, in accordance with some embodiments.

FIG. 11 is a schematic diagram of DLL circuit 1100, in accordance with some embodiments. DLL circuit 1100 includes a phase detector 1110, a low pass filter 1120, and a DCDL circuit 1130. Phase detector 1110 includes input terminals (not labeled) configured to receive a reference clock signal CLKR and a system clock signal CLKS, and an output terminal (not labeled) coupled to an input terminal (not labeled) of low pass filter 1120. DCDL circuit 1130 includes an input terminal (not labeled) coupled to an output terminal (not labeled) of low pass filter 1120, and an output terminal (not labeled) configured to output system clock signal CLKS.

Phase detector 1110 is an electronic circuit configured to detect a phase difference between reference clock signal CLKR and system clock signal CLKS, and output a voltage level indicative of the detected phase difference.

Low pass filter 1120 is an electronic circuit configured to pass the voltage level from phase detector 1110 to DCDL 1130 while attenuating alternating current (AC) signal components.

DCDL circuit 1130 is one of DCDL circuits 100-300 discussed above with respect to FIGS. 1-3 or DCDL circuits 900A-900D discussed above with respect to FIGS. 9A-9D including control circuit 120 configured to cause DCDL circuit 1130 to generate system clock signal CLKS by implementing a programmable delay time based on the voltage level received from low pass filter 1120.

DLL circuit 1100 is thereby configured to generate system clock signal CLKS having a phase synchronized to a phase of reference clock signal CLKR.

By including one of DCDL circuits 100-300 or 900A-900B, DLL circuit 1100 is capable of synchronizing clock signals CLKR and CLKS based on delay times generated in accordance with the embodiments discussed above, and thereby realizes the benefits discussed above with respect to DCDL circuits 100-300 and 900A-900D.

In some embodiments, a DCDL includes an input terminal, an output terminal, and a plurality of stages configured to propagate a signal along a first signal path from the input terminal to a selectable return stage of the plurality of stages, and along a second signal path from the return stage of the plurality of stages to the output terminal, each stage of the plurality of stages including a first inverter configured to selectively propagate the signal along the first signal path, a second inverter configured to selectively propagate the signal along the second signal path, and a third inverter configured to selectively propagate the signal from the first signal path to the second signal path. At least one of the first or third inverters includes a tuning portion including either a plurality of independently controllable p-type transistors configured in parallel and coupled in series with a single independently controllable n-type transistor, or a plurality of independently controllable n-type transistors configured in parallel and coupled in series with a single independently controllable p-type transistor. In some embodiments, the third inverter includes the tuning portion, and each stage of the plurality of stages includes a fourth inverter configured to selectively propagate the signal along the first signal path, and a fifth inverter configured to selectively propagate the signal along the second signal path. In some embodiments, the DCDL includes a return inverter configured to propagate the signal from the first inverter of a last stage of the plurality of stages to the second inverter of the last stage of the plurality of stages. In some embodiments, the third inverter includes the tuning portion including a first one of the plurality of independently controllable p-type transistors or the plurality of independently controllable n-type transistors, each stage of the plurality of stages includes a fourth inverter configured to selectively propagate the signal from the first signal path to the second signal path, and the fourth inverter includes the tuning portion including a second one of the plurality of independently controllable p-type transistors or the plurality of independently controllable n-type transistors. In some embodiments, the DCDL includes a return path configured to propagate the signal from the first inverter of a last stage of the plurality of stages to the second inverter of the last stage of the plurality of stages. In some embodiments, each stage of a first subset of the plurality of stages includes each of the first and third inverters including the tuning portion including a first one of the plurality of independently controllable p-type transistors or the plurality of independently controllable n-type transistors, each stage of a second subset of the plurality of stages includes each of the first and third inverters including the tuning portion including a second one of the plurality of independently controllable p-type transistors or the plurality of independently controllable n-type transistors, and the first and second subsets of the plurality of stages are located at alternating positions along the DCDL. In some embodiments, the DCDL includes a return inverter configured to propagate the signal from the first inverter of a last stage of the plurality of stages to the second inverter of the last stage of the plurality of stages. In some embodiments, each stage of a first subset of the plurality of stages includes the third inverter including the tuning portion including a first one of the plurality of independently controllable p-type transistors or the plurality of independently controllable n-type transistors, each stage of a second subset of the plurality of stages includes the third inverter including the tuning portion including a second one of the plurality of independently controllable p-type transistors or the plurality of independently controllable n-type transistors, and the first and second subsets of the plurality of stages are located at alternating positions along the DCDL. In some embodiments, the DCDL includes a return inverter configured to propagate the signal from the first inverter of a last stage of the plurality of stages to the second inverter of the last stage of the plurality of stages. In some embodiments, the DCDL is included in a DLL circuit.

In some embodiments, a DCDL includes an input terminal, an output terminal, and a plurality of stages configured to propagate a signal along a first signal path from the input terminal to a selectable return stage of the plurality of stages, and along a second signal path from the return stage of the plurality of stages to the output terminal, each stage of the plurality of stages including a first inverter configured to selectively propagate the signal along the first signal path, a second inverter configured to selectively propagate the signal along the second signal path, and a third inverter configured to selectively propagate the signal from the first signal path to the second signal path. At least one of the first or third inverters includes a first p-type transistor and a first n-type transistor, each of the first p-type transistor and the first n-type transistor including a gate configured to receive the signal, and a tuning portion coupled between the first p-type transistor and the first n-type transistor, the tuning portion including either a parallel configuration of independently controllable p-type transistors coupled in series with a single independently controllable n-type transistor or a parallel configuration of independently controllable n-type transistors coupled in series with a single independently controllable p-type transistor. In some embodiments, the third inverter includes the tuning portion, each stage of the plurality of stages includes a fourth inverter configured to selectively propagate the signal along the first signal path and a fifth inverter configured to selectively propagate the signal along the second signal path, and the DCDL includes a return inverter configured to propagate the signal from the first inverter of a last stage of the plurality of stages to the second inverter of the last stage of the plurality of stages. In some embodiments, the third inverter includes the tuning portion including a first one of the parallel configuration of independently controllable p-type transistors or the parallel configuration of independently controllable n-type transistors, each stage of the plurality of stages includes a fourth inverter configured to selectively propagate the signal from the first signal path to the second signal path, the fourth inverter includes the tuning portion including a second one of the parallel configuration of independently controllable p-type transistors or the parallel configuration of independently controllable n-type transistors, and the DCDL includes a return path configured to propagate the signal from the first inverter of a last stage of the plurality of stages to the second inverter of the last stage of the plurality of stages. In some embodiments, each stage of a first subset of the plurality of stages includes the third inverter including the tuning portion including a first one of the parallel configuration of independently controllable p-type transistors or the parallel configuration of independently controllable n-type transistors, each stage of a second subset of the plurality of stages includes the third inverter including the tuning portion including a second one of the parallel configuration of independently controllable p-type transistors or the parallel configuration of independently controllable n-type transistors, the first and second subsets of the plurality of stages are located at alternating positions along the DCDL, and the DCDL includes a return inverter configured to propagate the signal from the first inverter of a last stage of the plurality of stages to the second inverter of the last stage of the plurality of stages. In some embodiments, each stage of the first subset of the plurality of stages includes the first inverter including the tuning portion including the first one of the parallel configuration of independently controllable p-type transistors or the parallel configuration of independently controllable n-type transistors, and each stage of the second subset of the plurality of stages includes the first inverter including the tuning portion including the second one of the parallel configuration of independently controllable p-type transistors or the parallel configuration of independently controllable n-type transistors.

In some embodiments, a method of controlling a signal delay time includes receiving an input signal at a first stage of a plurality of sequentially coupled stages of a DCDL and selecting a second stage of the plurality of sequentially coupled stages as a return stage, thereby activating a first tunable inverter of the second stage. Activating the first tunable inverter of the second stage includes activating one of a parallel configuration of independently controllable p-type transistors coupled in series with a single independently controllable n-type transistor or a parallel configuration of independently controllable n-type transistors coupled in series with a single independently controllable p-type transistor. In some embodiments, activating the first tunable inverter of the second stage includes activating a first inverter configured to selectively propagate the input signal from a forward signal path to a return signal path. In some embodiments, selecting the second stage of the plurality of sequentially coupled stages as the return stage further activates a second tunable inverter of the first stage configured to selectively propagate the input signal along the forward path. In some embodiments, activating the first tunable inverter of the second stage includes activating a first one of the parallel configuration of independently controllable p-type transistors coupled in series with the single independently controllable n-type transistor or the parallel configuration of independently controllable n-type transistors coupled in series with the single independently controllable p-type transistor, selecting the second stage of the plurality of sequentially coupled stages as the return stage further activates a second tunable inverter of the second stage coupled in series with the first tunable inverter, and activating the second tunable inverter of the second stage includes activating a second one of the parallel configuration of independently controllable p-type transistors coupled in series with the single independently controllable n-type transistor or the parallel configuration of independently controllable n-type transistors coupled in series with the single independently controllable p-type transistor. In some embodiments, activating the first tunable inverter of the second stage includes operating the DCDL included in a DLL circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A digitally controlled delay line (DCDL) comprising:
an input terminal;
an output terminal; and
a plurality of stages configured to propagate a signal along a first signal path from the input terminal to a selectable return stage of the plurality of stages, and along a second signal path from the return stage of the plurality of stages to the output terminal, each stage of the plurality of stages comprising:
a first inverter configured to selectively propagate the signal along the first signal path;
a second inverter configured to selectively propagate the signal along the second signal path; and
a third inverter configured to selectively propagate the signal from the first signal path to the second signal path,
wherein at least one of the first or third inverters comprises a tuning portion comprising either:
a plurality of independently controllable p-type transistors configured in parallel and coupled in series with a single independently controllable n-type transistor; or
a plurality of independently controllable n-type transistors configured in parallel and coupled in series with a single independently controllable p-type transistor.

2. The DCDL of claim 1, wherein
the third inverter comprises the tuning portion, and
each stage of the plurality of stages further comprises:
a fourth inverter configured to selectively propagate the signal along the first signal path; and
a fifth inverter configured to selectively propagate the signal along the second signal path.

3. The DCDL of claim 2, further comprising a return inverter configured to propagate the signal from the first inverter of a last stage of the plurality of stages to the second inverter of the last stage of the plurality of stages.

4. The DCDL of claim 1, wherein
the third inverter comprises the tuning portion comprising a first one of the plurality of independently controllable p-type transistors or the plurality of independently controllable n-type transistors,
each stage of the plurality of stages further comprises a fourth inverter configured to selectively propagate the signal from the first signal path to the second signal path, and
the fourth inverter comprises the tuning portion comprising a second one of the plurality of independently controllable p-type transistors or the plurality of independently controllable n-type transistors.

5. The DCDL of claim 4, further comprising a return path configured to propagate the signal from the first inverter of a last stage of the plurality of stages to the second inverter of the last stage of the plurality of stages.

6. The DCDL of claim 1, wherein
each stage of a first subset of the plurality of stages comprises each of the first and third inverters comprising the tuning portion comprising a first one of the plurality of independently controllable p-type transistors or the plurality of independently controllable n-type transistors, each stage of a second subset of the plurality of stages comprises each of the first and third inverters comprising the tuning portion comprising a second one of the plurality of independently controllable p-type transistors or the plurality of independently controllable n-type transistors, and the first and second subsets of the plurality of stages are located at alternating positions along the DCDL.

7. The DCDL of claim 6, further comprising a return inverter configured to propagate the signal from the first inverter of a last stage of the plurality of stages to the second inverter of the last stage of the plurality of stages.

8. The DCDL of claim 1, wherein each stage of a first subset of the plurality of stages comprises the third inverter comprising the tuning portion comprising a first one of the plurality of independently controllable p-type transistors or the plurality of independently controllable n-type transistors, each stage of a second subset of the plurality of stages comprises the third inverter comprising the tuning portion comprising a second one of the plurality of independently controllable p-type transistors or the plurality of independently controllable n-type transistors, and the first and second subsets of the plurality of stages are located at alternating positions along the DCDL.

9. The DCDL of claim 8, further comprising a return inverter configured to propagate the signal from the first inverter of a last stage of the plurality of stages to the second inverter of the last stage of the plurality of stages.

10. The DCDL of claim 1, wherein the DCDL is included in a delay-locked loop (DLL) circuit.

11. A digitally controlled delay line (DCDL) comprising:
an input terminal;
an output terminal; and
a plurality of stages configured to propagate a signal along a first signal path from the input terminal to a selectable return stage of the plurality of stages, and along a second signal path from the return stage of the plurality of stages to the output terminal, each stage of the plurality of stages comprising:
a first inverter configured to selectively propagate the signal along the first signal path;
a second inverter configured to selectively propagate the signal along the second signal path; and
a third inverter configured to selectively propagate the signal from the first signal path to the second signal path,
wherein at least one of the first or third inverters comprises:
a first p-type transistor and a first n-type transistor, each of the first p-type transistor and the first n-type transistor comprising a gate configured to receive the signal; and
a tuning portion coupled between the first p-type transistor and the first n-type transistor, the tuning portion comprising either:
a parallel configuration of independently controllable p-type transistors coupled in series with a single independently controllable n-type transistor; or
a parallel configuration of independently controllable n-type transistors coupled in series with a single independently controllable p-type transistor.

12. The DCDL of claim 11, wherein
the third inverter comprises the tuning portion,
each stage of the plurality of stages further comprises:
a fourth inverter configured to selectively propagate the signal along the first signal path; and
a fifth inverter configured to selectively propagate the signal along the second signal path, and
the DCDL further comprises a return inverter configured to propagate the signal from the first inverter of a last stage of the plurality of stages to the second inverter of the last stage of the plurality of stages.

13. The DCDL of claim 11, wherein
the third inverter comprises the tuning portion comprising a first one of the parallel configuration of independently controllable p-type transistors or the parallel configuration of independently controllable n-type transistors,
each stage of the plurality of stages further comprises a fourth inverter configured to selectively propagate the signal from the first signal path to the second signal path,
the fourth inverter comprises the tuning portion comprising a second one of the parallel configuration of independently controllable p-type transistors or the parallel configuration of independently controllable n-type transistors, and
the DCDL further comprises a return path configured to propagate the signal from the first inverter of a last stage of the plurality of stages to the second inverter of the last stage of the plurality of stages.

14. The DCDL of claim 11, wherein
each stage of a first subset of the plurality of stages comprises the third inverter comprising the tuning portion comprising a first one of the parallel configuration of independently controllable p-type transistors or the parallel configuration of independently controllable n-type transistors,
each stage of a second subset of the plurality of stages comprises the third inverter comprising the tuning portion comprising a second one of the parallel configuration of independently controllable p-type transistors or the parallel configuration of independently controllable n-type transistors,
the first and second subsets of the plurality of stages are located at alternating positions along the DCDL, and
the DCDL further comprises a return inverter configured to propagate the signal from the first inverter of a last stage of the plurality of stages to the second inverter of the last stage of the plurality of stages.

15. The DCDL of claim 14, wherein
each stage of the first subset of the plurality of stages further comprises the first inverter comprising the tuning portion comprising the first one of the parallel configuration of independently controllable p-type transistors or the parallel configuration of independently controllable n-type transistors, and
each stage of the second subset of the plurality of stages further comprises the first inverter comprising the tuning portion comprising the second one of the parallel configuration of independently controllable p-type transistors or the parallel configuration of independently controllable n-type transistors.

16. A method of controlling a signal delay time, the method comprising:
receiving an input signal at a first stage of a plurality of sequentially coupled stages of a digitally controlled delay line (DCDL); and selecting a second stage of the plurality of sequentially coupled stages as a return stage, thereby activating a first tunable inverter of the second stage,
wherein the activating the first tunable inverter of the second stage comprises activating one of:
  a parallel configuration of independently controllable p-type transistors coupled in series with a single independently controllable n-type transistor, or
  a parallel configuration of independently controllable n-type transistors coupled in series with a single independently controllable p-type transistor.

17. The method of claim 16, wherein the activating the first tunable inverter of the second stage comprises activating a first inverter configured to selectively propagate the input signal from a forward signal path to a return signal path.

18. The method of claim 17, wherein the selecting the second stage of the plurality of sequentially coupled stages as the return stage further activates a second tunable inverter of the first stage configured to selectively propagate the input signal along the forward path.

19. The method of claim 16, wherein
the activating the first tunable inverter of the second stage comprises activating a first one of the parallel configuration of independently controllable p-type transistors coupled in series with the single independently controllable n-type transistor or the parallel configuration of independently controllable n-type transistors coupled in series with the single independently controllable p-type transistor,
the selecting the second stage of the plurality of sequentially coupled stages as the return stage further activates a second tunable inverter of the second stage coupled in series with the first tunable inverter, and
activating the second tunable inverter of the second stage comprises activating a second one of the parallel configuration of independently controllable p-type transistors coupled in series with the single independently controllable n-type transistor or the parallel configuration of independently controllable n-type transistors coupled in series with the single independently controllable p-type transistor.

20. The method of claim 16, wherein the activating the first tunable inverter of the second stage comprises operating the DCDL included in a delay-locked loop (DLL) circuit.

* * * * *